US005473546A

United States Patent [19]
Filseth

[11] Patent Number: 5,473,546
[45] Date of Patent: Dec. 5, 1995

[54] METHOD FOR FLATTENING HIERARCHICAL DESIGN DESCRIPTIONS

[75] Inventor: Paul Filseth, Newark, Calif.

[73] Assignee: LSI Logic Corporation, Milpitas, Calif.

[21] Appl. No.: 715,114

[22] Filed: Jun. 12, 1991

[51] Int. Cl.$^6$ .................................................. G06F 17/50
[52] U.S. Cl. ................................ 364/489; 364/488
[58] Field of Search .................................. 364/488, 489, 364/490, 491, 578

[56] References Cited

U.S. PATENT DOCUMENTS

| | | | |
|---|---|---|---|
| 4,635,208 | 1/1987 | Coleby et al. | 364/491 |
| 4,922,432 | 5/1990 | Kobayashi et al. | 364/490 |
| 5,034,899 | 7/1991 | Schult | 364/488 |
| 5,084,824 | 1/1992 | Lam et al. | 364/490 |
| 5,111,413 | 5/1992 | Lazansky et al. | 364/578 |
| 5,164,908 | 11/1992 | Igarashi | 364/491 |
| 5,164,911 | 11/1992 | Juran et al. | 364/578 |

OTHER PUBLICATIONS

"IDEAS–An Integrated Design Automation System" by Z. Mehmood et al., 1987 IEEE International Conference on Computer Design: VLSI in Computers & Processors, Oct. 5–8, 1987, pp. 407–412.
"Circuit Compilers Dont't Have To Be Slow" by William C. Diss, 25th ACM/IEEE Design Automation Conference, IEEE 1987, pp. 622–627.

Primary Examiner—Vincent N. Trans

[57] ABSTRACT

The invention describes a method for expanding (flattening) hierarchical descriptions of electronic circuits into flat descriptions. The method is characterized by two processes: one which eliminates feed-through and implicit signals, and another which pre-plans the layout of the flattened data structure before flattening. The flattening process may then take advantage of a number of resulting efficiencies to operate more quickly than present flatteners.

6 Claims, 8 Drawing Sheets

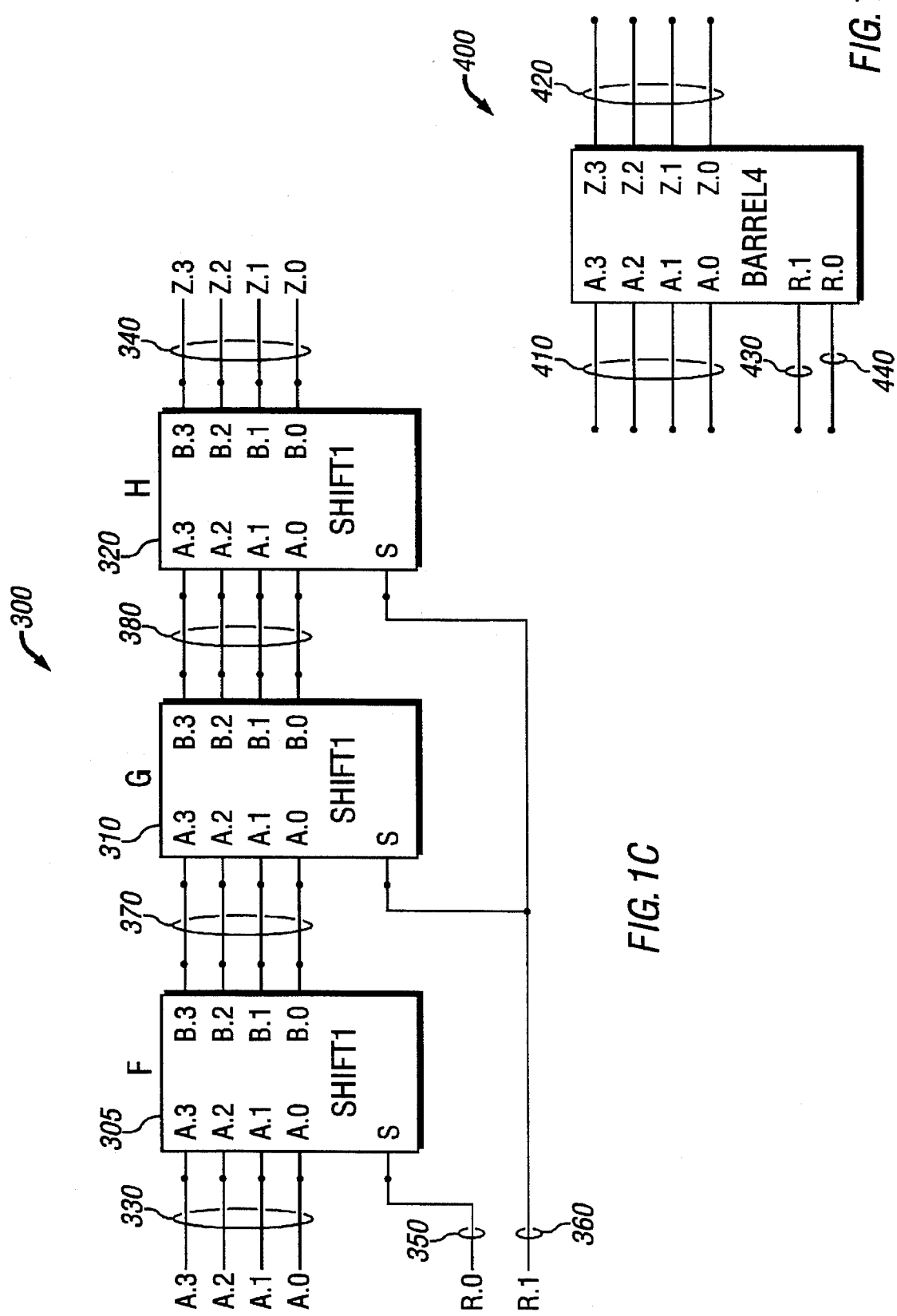

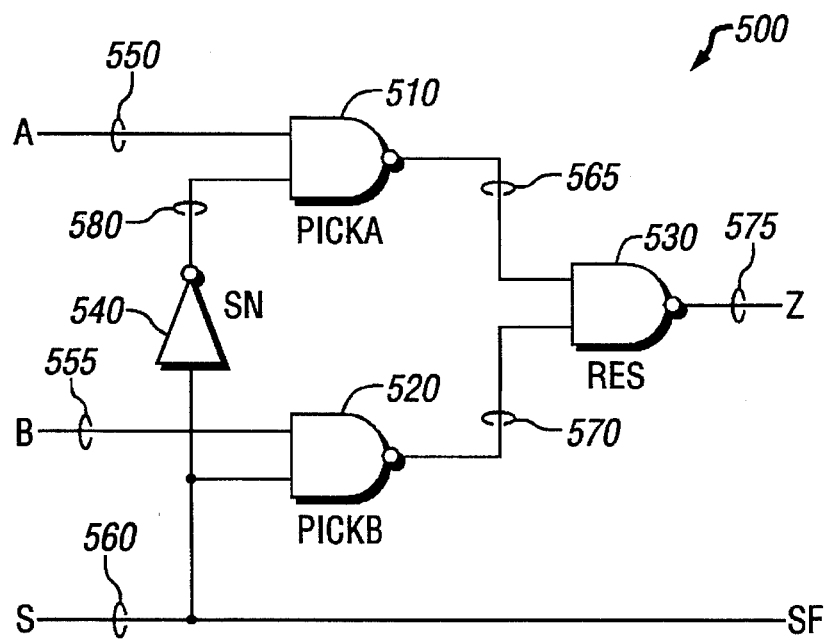
*FIG. 1E*
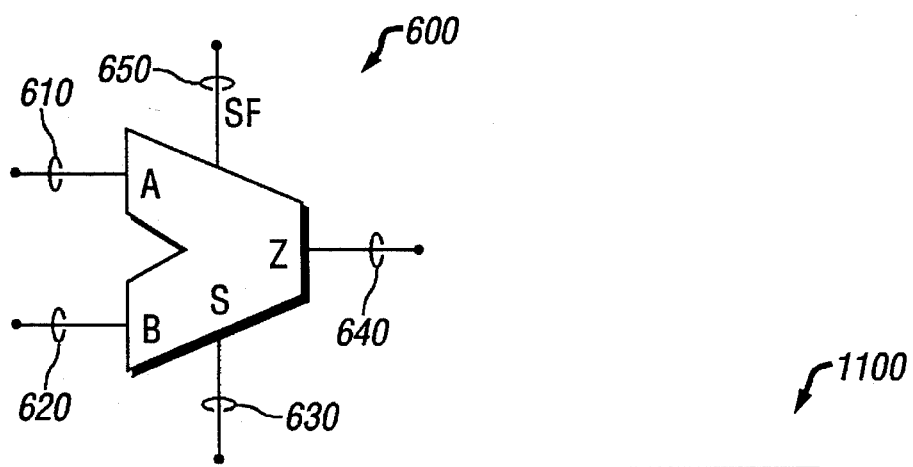
*FIG. 1F*
*FIG. 1G*

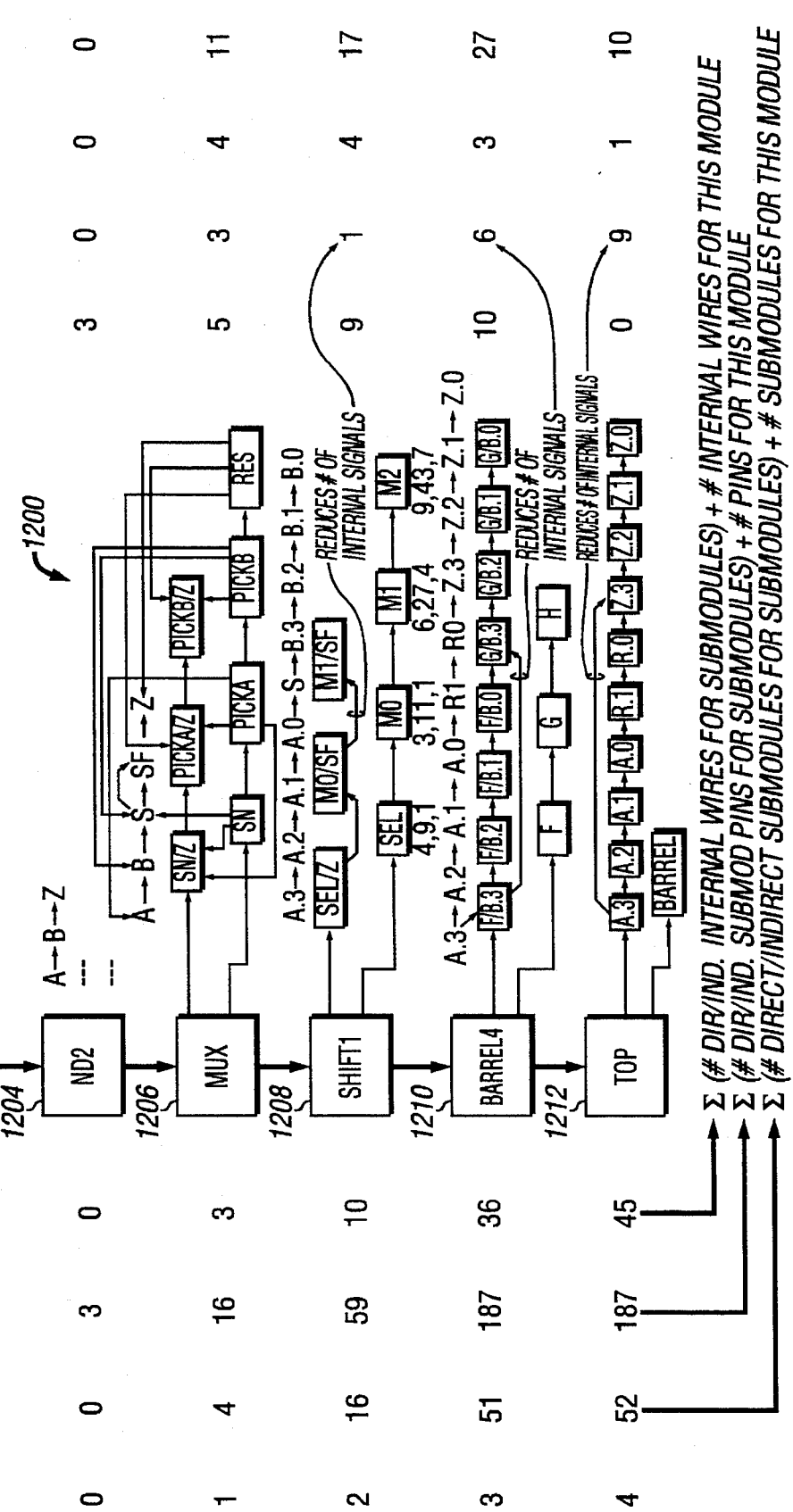

METHOD FOR FLATTENING HIERARCHICAL DESIGN DESCRIPTIONS

TECHNICAL FIELD OF THE INVENTION

The present invention relates to the process of expanding, or flattening hierarchical design descriptions, and particularly to flattening such descriptions on electronic computer-aided-design (ECAD) systems.

BACKGROUND OF THE INVENTION

Modern electronic systems are often designed with the assistance of electronic computer-aided-design tools, hereinafter referred to as ECAD tools. Typically, a user will capture a schematic diagram or other convenient form of circuit description on a display screen of an ECAD system using any of a number of interactive or automatic (e.g., module generators, silicon compilers, logic synthesizers) techniques widely known in the present art. As a part of the design process, a designer will typically capture and compile a design and then simulate it through the use of a logic simulator.

Complex logic circuits are customarily described hierarchically, but are simulated flat (or fully expanded). This means that if a module A in a user's design contains three instances of a submodule B, and submodule B contains two instances of another submodule C, the user will declare only two copies of submodule C in the process of capturing his design, but because of the implied replication in the user's design, the simulator will simulate six instances of submodule C for each instance of module A, since there are two instances of submodule C in each of the three instances of submodule B comprising module A. When such a circuit description is modified and re-simulated, a program must read the hierarchical description and produce a flat, or fully expanded, description of the hierarchical design before the simulation may be accomplished. A program that accomplishes this function is called a "linker" or "flattener". Hereinafter, the terms "link" and "flatten" will be used interchangeably. All modern ECAD systems include such a program, since a flat circuit description is too cumbersome for users to create directly, and a hierarchical description cannot easily be simulated directly, because the many different instances of the submodules of a hierarchy may be in different states during simulation and must be dealt with individually by the simulator.

Inputs to a linker generally consist of a set of circuit descriptions of different hierarchical levels or "modules" in a circuit. Each module description contains a list of submodules, internal wires (also called "signals" or "nets"), and I/O (input/output) pins. Each I/O pin of the module's submodules is connected to one of the module's internal wires. Some of those wires are in turn connected to I/O pins of the module itself. The details of these interconnections are also a part of the module description. In addition, the module description contains the name of the module, the name of each submodule, internal wire, and I/O pin the module comprises. Any module may itself be a submodule of another module; further illustrating the impact of hierarchy on a design.

These inputs to the linker may be either memory-resident data structures, or data structures contained in files on an on-line mass-storage device. Since it is a relatively trivial process to move data structures between files and memory, it will be assumed hereinafter without loss of generality that all linker inputs are memory-resident.

The output from a linker is a flattened, or expanded, description of the input circuit descriptions. It contains an explicit representation of every copy of every bottom-level submodule in the circuit design. The term "bottom-level submodule" refers to submodules at the bottom level of a circuit hierarchy for which no further expansion is possible, i.e., submodules which comprise no further submodules. Hereinafter, such bottom-level submodules will be referred to interchangeably as "primitives". Each primitive has I/O connections (pins) which are explicitly represented, but which may be replicated in multiple instances of the primitive. Connections between I/O pins of primitives may be made at a higher level of hierarchy where the details of the lower levels of circuit interconnection are not explicitly visible, but which do exist.

Some ECAD systems have special features which complicate the process of linking, or flattening, a design description. Some examples of such features are:

a. Global Signals:

This feature allows wires to pass from one module to another without passing through explicitly declared I/O pins of either module. This is primarily used for "universal" signals such as power supplies and master clocks. Because these connections are "assumed" and not explicitly declared in a circuit description, a linker must deal with these signals in a less straightforward fashion than would otherwise be possible.

b. Primitive modules with variable numbers of I/O pins:

This capability is used mainly for RAM (random access memory) primitives so that one primitive may be used to describe RAMs of many different sizes. An instance of such a primitive would have as part of its description a list of parameters which would affect the number and type of I/O pins on that instance of the primitive. Again, a linker would have to handle this special situation.

c. Primitives with unconnected inputs:

Simple logic gate primitives may have unconnected inputs. For example, a 3-input NAND gate may have one input unconnected. The ECAD system would recognize the condition and compute a 2 input NAND function in its place. The makes it unnecessary to have separate 2-input and 3-input NAND primitives. This situation must be taken into account by a linker.

d. Module I/O pins wired together:

"Feed-through" pins are sometimes allowed by ECAD systems. In these cases, two pins are declared and shown graphically, but are wired together internally. This is usually done as a graphical convenience to the ECAD user. A linker would have to replace two or more nets connected to pins of this type with a single net, since all are connected together in the lower levels of hierarchy.

e. Connections by position and by name:

Some ECAD systems allow wires to be attached either to a submodule pin with a specified name or to a submodule pin in a specified position. If one wire is connected to a pin named "X" and another wire is connected to a pin number 3, it is the responsibility of the linker to determine whether those wires are connected to each other by checking whether pin number 3 is named "X" or not. This requires linker actions similar to those for module pins wired together.

Typically, schematic capture tools use connection by name, while automatic module generators use connection by position. The ability to support both styles would be of value and, as will become evident, is incorporated in the present invention.

Typical linker (or flattener) programs consist of four main processing tasks. These are:

a. Loading the hierarchical design description.

b. Altering the module designs to reflect information about their submodules (such as implicit power connections, multiple pins with the same signal, etc.) which was not previously available. The effect is to explicitly reference any portions of the submodule which would otherwise be considered implicit. This step is not required if certain design restrictions are placed on the design methodology which eliminate the possibility of feed-through connections or "implied" connections where a connection may be made without a user-drawn "wire". This task is performed by using a pin-name list or equivalent data structure to merge signals (also called wires or nets) which are not explicitly connected by a wire, but which are assumed to be connected by name or other convention.

c. Creating copies (instances) of those (sub)module descriptions which are used more than once, i.e., if a module is applied to a circuit design more than once, it is necessary to replicate the module description (or at least those parameters which make an instance of a module unique) so that a subsequent simulation process may treat each instance of the module separately. This is accomplished by scanning the module design and creating a copy each time a module instance is detected; then performing the same operation recursively to the copy. This process creates a flattened representation (or design description) of the input hierarchical design, typically in the form of a tree structure. Typically, the entire module description is not copied for each instance. Instead, each copy will typically contain a reference to the master copy and parameter space for information about explicit connections and internal state. The reference to the original allows information which is common to all instances of a module to be shared, saving time and storage space.

d. Connecting the copies together in accordance with the wiring directions found in each module design. That is, information relating to inter-module connections is stored in the copies of the module descriptions, allowing further processing steps to have full knowledge of signal routing within the circuit design. This task is performed by visiting every submodule I/O pin in the flattened design description, and tracing through the hierarchical design description to find every other I/O pin in the flattened design which connects to it. This involves traversing the various levels of hierarchy from module description to module description, until all interconnections in the flattened design have been resolved. When this process is complete, each group of commonly connected pins will have a "net" assignment, and each module I/O pin will have been marked with the number or name of the net to which it is connected. This task is typically the most time-consuming of the four tasks listed here.

An approach which combines the tasks of creating and connecting copies (c and d, above) is reported by Mentor Graphics Corp. in Paper 39.3 of the 1988 DAC (25th ACM/IEEE Design Automation Conference) Proceedings. This paper describes a technique whereby the module description copies are wired together (i.e., nets are created and I/O pins assigned to them) as the copies are created. The technique provides a substantial performance improvement over the typical process described above, but does not provide for resolution of feed-through pins.

As will become evident hereinafter, the present invention is considerably faster than the Mentor algorithm; only the factor is smaller.

The primary disadvantage of present linking algorithms is that they are slow, and some are inflexible. Engineers typically spend most of their design time in an "Edit-Compile-Simulate" iterative process. After simulating a version of a circuit design, an engineer will typically make a modification which he hopes will improve the circuit performance or correct a problem detected in simulation. He then runs the programs which prepare the circuit for simulation (that is, he "compiles" the circuit), re-simulates, studies the simulation output to determine success or failure of the circuit modifications and determines whether further modifications are required. Any decrease in the time required to prepare a circuit for simulation provides a direct time benefit to the engineer which is experienced as many times as the "Edit-Compile-Simulate" process is repeated.

DISCLOSURE OF THE INVENTION

It is therefore an object of the present invention to provide a method of flattening hierarchical design descriptions which is more time-efficient than previous methods.

It is a further object of the present invention to provide a time-efficient method of flattening hierarchical design descriptions which is capable of supporting feed-through signals.

It is a further object of the present invention to provide a time-efficient method of flattening hierarchical design descriptions which is capable of supporting implicitly declared signals, such as global clock signals.

It is a further object of the present invention to provide a time-efficient method of flattening hierarchical design descriptions which is capable of supporting signals connected to modules by either name or position, even if no cross-reference table is available prior to linking.

It is a further object of the present invention to provide a time-efficient method of flattening hierarchical design descriptions which is capable of supporting primitives with unconnected inputs.

It is a further object of the present invention to provide a time-efficient method of flattening hierarchical design descriptions which is capable of supporting primitives with variable numbers of pins.

According to the present invention, there is provided a method for flattening (linking) hierarchical design descriptions.

The method, in total, involves nine steps, described hereinafter, but is most readily understood in terms of how it differs from the methods of the prior art. It differs in at least two important features:

According to a first feature of the invention, feed-through information and information about implicit connections is propagated up through the design hierarchy before the flattening process begins. Variable pin connections apply only to primitives and have no effect on higher-level modules, so the information is not propagated up.

According to a second feature of the invention, a plan for the layout of the flattened data structure is created before making any module copies (i.e., instantiating modules or submodules).

The process of propagating feed-throughs prior to flattening allows signals which are distinct in a particular module design but which are actually equivalent in a submodule to be merged, and for signals that are implicitly present in a module design to be made explicit, such that hierarchical module designs accurately reflect the actual electrical connectivity of the represented circuit. This makes it possible to merge the process of net assignment into the process of module replication, while still supporting the special features of feed-through pins. Since a module may contain a feed-through that passes through a feed-through in a submodule, it is essential that this information be computed for all submodule types used directly or indirectly by a given module type before the feed-through information for that module type is computed. For this to be done, a "level number" specifying the number of (hierarchical) levels between a given module type and the lowest level of the hierarchy is computed for each module type. The feed-through analysis is performed on the module types in order from the lowest level to the highest, and effectively eliminates feed-throughs in the flattened design by combining equivalent nets into a single net. The same order is used for analysis of implicit connections, since a signal implicitly present in a submodule is thereby also implicitly present in the module that contains the submodule.

The terms "module type" and "submodule type" are used herein to refer to distinct module designs which may be incorporated into other modules. For example, a two input NAND gate may be one module type and a two input NOR gate may be another module type. Each may be included many times in other module designs. Another module type may be created which is created of these two module types, and which may be further included in other modules. A module type is a description of a circuit structure, whereas a "module", a "submodule", or an "instance" of a module type (or just "instance") is a particular usage of a module type.

The process of pre-planning the layout of the flattened data structure before copying module descriptions pre-computes the relative positions of each part of every substructure within the overall flattened data structure and specifies the offset of every substructure within the structure which contains it. These positions and offsets are computed once for each reference to a module design within another module design. While the number of these references and their associated position/offset pairs is greater than the number of distinct types of modules, it is much smaller than the number of module instances in the flattened design data structure.

This pre-planning is a distinctly different approach than that of the prior art where every address in a copy of a module is calculated by a complicated algorithm. In the present invention, all of these calculations are avoided, and are replaced (in a manner of speaking) with a simple position/offset addition using pre-calculated positions and offsets. As a result, the time spent in the flattening process is greatly reduced.

The pre-planning process divides the I/O pins of a module's submodules into two classes: those that are connected to higher level modules and those that are not.

An example of submodule pins not connected to higher level pins is the case where submodules' pins in a higher level module design are inter-connected, but the net that connects them does not connect to the external pins of the module. A graphic example of this is shown in FIG. 1e where signal 565 inter-connects an output pin of module 510 to an input pin of module 530, but has no further external connections. By way of contrast, signal 560 connects an input of module 540 and an input of module 520 to two external module connection points labeled "S" and "SF".

It should also be noted that the inter-connection of external connection points "S" and "SF" is an example of a feed-through connection, where two external connections are electrically identical at a lower level.

The net ID numbers of pins that are not connected to higher level modules are computed in the same way that other addresses are computed, by an offset and relative position technique. Each pin which is connected to a higher-level pin is marked in its data structure to indicate which higher level pin it is connected to. When the module copies are created, they are created from the top down, i.e., starting at the highest levels of hierarchy and moving downward. Thus, the ID number of the higher level pin that a submodule I/O pin connects to has already been computed when the ID number of the submodule I/O pin is to be determined. This ID number can then simply be copied from the higher level pin, since electrically they are one and the same. As a result, the time spent in creating the net list or interconnection list is reduced.

In order to determine the relative positions and offsets of pin ID numbers, the number and connectivity of internal nets of modules must be determined. This information can be affected by the presence of feed-throughs in the module's submodules. This means that this pre-planning technique cannot be used unless feed-throughs are prohibited, or a method for handling them such as is described above is used.

According to an aspect of the invention, the entire flattened data structure resides in a block of contiguous memory segments, due to the pre-computed address/offset scheme. This means that storage space in memory can be assigned all at once, rather than in small, ad hoc, time-consuming pieces. The allocation of block (preferably contiguous) memory space is feasible, because a side-effect of the pre-planning process is that the total memory space required for the flattened design is computed (i.e., known) before the actual expansion (flattening process) begins. This feature of allocating (requesting) memory in one large lump eliminates much of the time spent in memory allocation by some flatteners of the prior art. Preferably, memory allocation is in a physically contiguous block. However, it can also be a small number of contiguous blocks of memory, for example having a contiguous physical memory block for each instance array.

Such block memory allocation is responsible for a small performance improvement.

In the flattened design description, sub-structures representing two instances of the same module type are very similar to one another, but not identical since interconnections and instance names differ. As a result, they cannot be copied as a whole. Since they sit in different parts of memory their internal structure is represented by different memory addresses. In spite of these differences, their overall structures are substantially alike. A fundamental difference between the present invention and the prior art is that the present invention takes advantage of this similarity in ways that the prior art does not, to speed the process of expansion.

Other objects, features and advantages of the present invention will become apparent in light of the following description thereof.

BRIEF DESCRIPTION OF THE DRAWINGS

FIGS. 1a–1g are schematic diagrams representing various levels of hierarchy and their respective schematic symbols for an exemplary hierarchical design to be flattened by the method of the present invention.

FIG. 3 is a graphical representation of a data structure created in the process of executing the method of the present invention, with respect to the example of FIGS. 1a–1g and 2a–2d.

DETAILED DESCRIPTION OF THE INVENTION

Figure 1A:
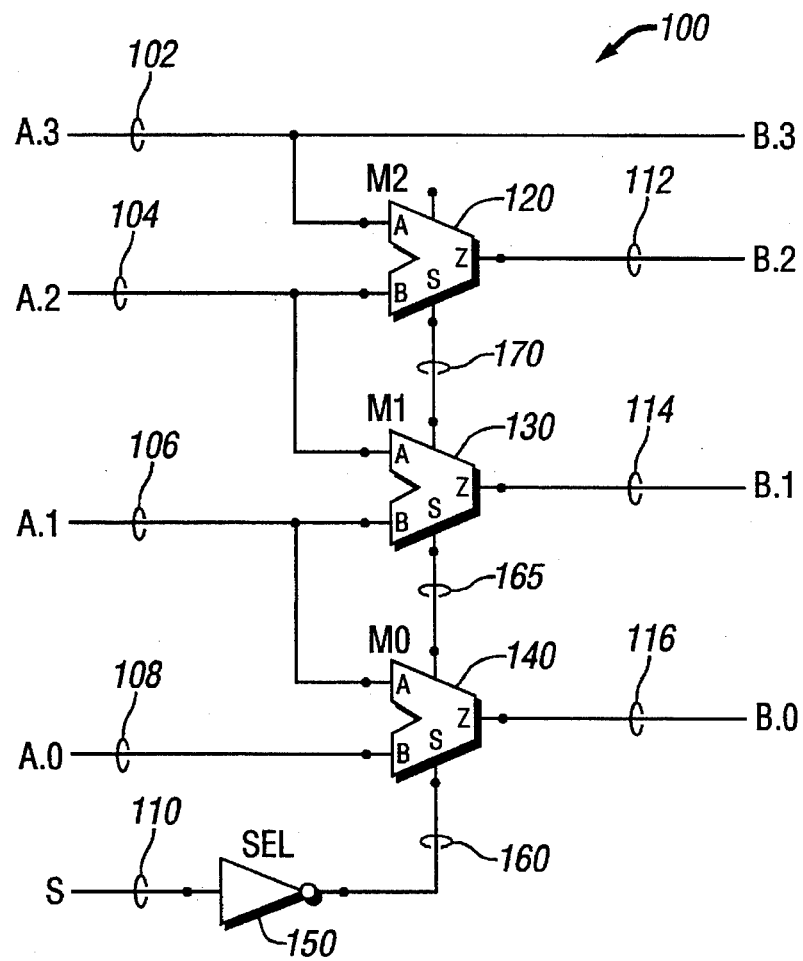

Before the process of analyzing and flattening a hierarchical design may begin, a computer program must collect descriptions of all of the modules. It reads in the top-level module, scans it for submodules and reads in their descriptions. Then the submodules are scanned in similar fashion for further submodules, whose descriptions are then read in. This process continues in like manner until the bottom level of hierarchy is reached and only primitives (bottom-level submodules) remain. Most linkers/flatteners of the prior art begin in this manner. Once the module descriptions are loaded, the process of the present invention begins.

The complete process of the present invention comprises nine main steps:

Step 1.

Creating (from whole cloth, so to speak) a highest level module to contain all other modules (i.e., the entire whole circuit description). This "top" module has internal signals for each I/O pin and top-level global signal. The "top" module includes all external connections as internal nets and has no I/O pins. This eliminates the need for special code to handle boundary conditions.

Step 2.

Determining the level of each module type in the hierarchy, that is, determine the number of levels between it and the bottom level of the hierarchy. For example, a primitive is defined as a bottom level (Level 0) module type and therefore has a level of zero. A module type with no submodules other than primitives has level one. A module type containing modules of level 1 but no higher has level 2, etc. The "top" module is at the highest level "n".

Step 3.

Placing the module descriptions in a list sorted in order of increasing hierarchical level.

Step 4.

Standardizing the module pin connection orders, that is, re-ordering the list of connections to each module of the same type so that they occur in exactly the same order by pin function. If some pins have been left unconnected, new internal wires (nets) must be created for those pins. If two wires are connected to the same pin, one by name and one by position, the wires must be merged into a single net. This involves destroying the net description for one of the wires and connecting every I/O or submodule pin that was connected to it to the net description for the other wire. If necessary in a specific design environment, bi-directional pins and variable input primitives may receive special treatment in this step since they each may represent one or more of these conditions.

Step 5.

Resolving all references to global variables. Each module type has a list of all global variables it uses (implicit connections from higher level modules) and all that it defines (provides for implicit connections to lower level modules). For each module description on the sorted list, all global signals used by any submodule of that module are found and any which are not already used or defined by that module are added to the list of global signals used by the module. This step has the effect of explicitly declaring all implicit connections to a module.

Step 6.

Identifying pins and wires which are connected together. This step determines what distinct internal wires a module type has, and what external wires enter the module type through I/O pins and global signals. If two pins are wired together, this step marks them as being connected to the same external wire. If two internal wires are connected through a submodule, one wire is deleted and the pins connected to it are reconnected to the other wire as in step 4. Each submodule I/O pin and global signal used by any submodule is associated with an internal or external wire. At the completion of this step, all feed-throughs will have been effectively "eliminated" and implicit signals will have been converted to explicit signals, resulting in a simplified ("plain-vanilla") version of the hierarchical design. (The feed-throughs are all still present in the circuit, but they become irrelevant electrically since each one connects some higher-level module's signal to itself. Feed-throughs are thus accounted for, and are not ignored.)

This process of propagating feed-throughs prior to flattening allows signals which are distinct in a particular module design but which are actually equivalent in a submodule to be merged such that hierarchical module designs accurately reflect the actual electrical connectivity of the represented circuit. This makes it possible to merge the process of net assignment into the process of module replication (see step 9, below), while still supporting the special feature of feed-through pins. Since a module may contain a feed-through that passes through a feed-through in a submodule, it is essential that this information be computed for all submodule types used directly or indirectly by a given module type before the feed-through information for that module type is computed. For this to be done, a level number specifying the number of levels between a given module and the lowest level of the hierarchy is computed (in Step 2) for each module type. The feed-through analysis is performed on the module types in order from the lowest level to the highest, and effectively eliminates feed-throughs in the flattened design by combining equivalent nets into a single net.

Again, the terms "module type" and "submodule type" are used herein to refer to distinct module designs which may be incorporated into other modules. For example, a two input NAND gate may be one module type and a two input NOR gate may be another module type. Each may be included many times into other module designs. Another module type may be created which is created of these two module types, and which may be further included into other modules.

A "module type" is a description of a circuit structure, whereas a "module", a "submodule", or an "instance" of a module type (or just "instance") is a particular usage of a module type.

Step 7.

Computing (counting and totalizing) the number of internal wires, submodules, and submodule pins directly or indirectly contained in each module type. In step 6, above, the number of these items used in each module type was made available by making all declarations explicit. This step adds them up hierarchically. A module contains the number of items that it directly contains plus the number contained directly or indirectly be each of its submodules. As this step of the method of the present invention proceeds for a module type, it keeps a running total of the item counts, and attaches them to the record for each submodule before it adds in that submodule's contribution to the counts. Thus each submodule record contains the partial sum of the counts for all previous submodules of the same module. These partial sums will be used as offsets into arrays in order to determine the location of the submodules of the module instance relative to the location of the module instance itself.

Step 8.

Allocating memory for the output data structure. Step 7, above, computed the number of items of various sorts contained in the module description for each module type. These figures for the top level module can be used to determine the amount of memory required for the flattened design description. Arrays of module instances, pin instances and wire instances are allocated.

Step 9.

Recursively flattening the circuit. The flattening routine takes four inputs: the module instance description of the module to be flattened, and pointers into the interiors of the three arrays of the flattened design description. A first pointer into the instance array specifies where that instance of the module being flattened is to be placed. A second pointer into the wire array specifies where the sub-array of internal wires for that instance is to be placed. A third pointer into the pin array specifies where the pins of that instance have been placed.

The offset to the first submodule which was computed in step 7 is added to the pointer into the instance array to get the pointer to the instance's submodules. This is stored in the instance record. The pointer into the pin array is also stored there. Then the records for the pins of the module instance's submodules are filled in. An offset (computed in Step 7) is added to the pin array argument to find their locations. Each pin record is given a pointer to the record for the submodule it belongs to. Each pin that is connected to an internal wire of the module is given a pointer to that wire by adding the wire number computed in step 6 to the pointer into the wire array. Each pin that is connected to an external wire is given a pointer to that wire by copying the pointer to that wire stored in the record for the appropriate I/O pin of that module. In step 6, the pin number of the correct pin was computed and the pin record itself is found by adding the pin number to the pointer into the pin array that was passed to the flattening routine. The record already contains the right wire because it was processed in the previous invocation of the recursive flattening routine.

Finally, each submodule of the module instance is given a parent pointer to the instance record, and is then itself flattened. The recursive call to the flattening routine is passed the module description of the submodule instance, the location in the instance array where it is to be placed, and pointers into the pin and wire arrays, which are found by adding the original pointer arguments to offsets computed in step 7. When this recursive processing step bottoms out (completes), the flattened circuit description is complete. (see FIG. 4)

As a generalized example, suppose module "A" contains three instances of module "B", module B contains two instances of module "C" and one instance of module "D", and module C contains one instance of module "E" and one instance of module "F". The instances will appear in the instance array as follows:

| | | | | |
|---|---|---|---|---|
| 0: | A | | | |
| 1: | | B1 | B2 | B3 |
| 4: | | | C11 | C12 | D11 |
| 7: | | | | E111 | F111 |
| 9: | | | | E121 | F121 |
| 11: | | | C21 | C22 | D21 |
| 14: | | | | E211 | F211 |
| 16: | | | | E221 | F221 |
| 18: | | | C31 | C32 | D31 |
| 21: | | | | E311 | F311 |
| 23: | | | | E321 | F321 |

The direct submodules of a module are placed in a contiguous array. The indirect submodules (e.g., sub-submodules) are placed after the direct submodules.

When the method of the present invention is used, the direct and indirect submodules of a module always have the same relative positions to one another in the instance array for all instances of the module, but may be a variable distance from the location of the module in the instance array. In this example, the distance in the instance array from C11 to E121 is the same as the distance from C21 to E221, since they are submodules of two instances of module B. However, the distance from B1 to C11 is less than the distance from B2 to C21. Thus, the description of module A must contain information about the distances from B1 to C11 and from B2 to C21, but need not contain information about the relative positions of the subcomponents of B1 and B2. Since it is only stored once for all three copies of B, it need be computed only once. Since traditional flattening algorithms compute the location of subcomponents directly without first determining relative positions, they must in effect recompute information for every instance of a module while the method of the present invention computes this same information only once for each module type.

With particular reference to Steps 6, 7 and 9, the process of pre-planning the layout of the flattened data structure before copying module descriptions pre-computes the relative positions of each part of every substructure within the overall flattened data structure, and specifies the offset of every substructure within the structure which contains it. These positions and offsets are therefore computed once for each reference to a module design within another module design. While the number of these references and their associated position/offset pairs is greater than the number of distinct types of modules, it is much smaller than the number of module instances in the flattened design data structure. This is distinctly different than the prior art where every address in a copy of a module is calculated by a complicated algorithm. Each such calculation is eliminated and replaced with a simple position/offset addition using pre-calculated positions and offsets. As a result, the time spent in the flattening process is greatly reduced.

The pre-planning process divides I/O pins of a module's submodules into two classes: those that are connected to higher level modules and those that are not. An example of submodule pins not connected to higher level pins is the case where submodules in a higher level module design are interconnected, but the net that connects them does not connect to the external pins of the module. A graphic example of this is shown in FIG. 1e where signal 565 interconnects an output pin of module 510 to an input pin of module 530, but has no further external connections. By way of contrast, signal 560 connects an input of module 540 and an input of module 520 to two external module connection points labeled "S" and "SF".

It should also be noted that the interconnection of external connections points "S" and "SF" is an example of a feed-through connection, where two external connections are electrically identical at a lower level. The net ID numbers of pins that are not connected to higher level modules are computed in the same way that other addresses are computed, by an offset and relative position technique. Each pin which is connected to a higher-level pin is marked in its data structure to indicate which higher level pin it is connected to. When the module copies are created, they are created from the top down, i.e., starting at the highest levels of hierarchy and moving downward. Thus, the ID number of the higher level pin that a submodule I/O pin connects to has already been computed when the ID number of the submodule I/O pin is to be determined. This ID number can then simply be copied from the higher level pin, since electrically they are one and the same. As a result, the time spent in creating the net list or interconnection list is reduced.

In order to determine the relative positions and offsets of pin ID numbers, the number and connectivity of internal nets of modules must be determined. This information can be affected by the presence of feed-throughs in the module's submodules. This means that this pre-planning technique cannot be used unless feed-throughs are banned or a method for handling them like the one described above is also used.

EXAMPLE

Consider the example design of FIG. 1(a–f), which is a design for a four-bit barrel shifter. The example is a multi-level hierarchy containing feed-through signals. Note that pins on graphical representations of submodules are denoted in this example by small dots.

FIG. 1a shows a low hierarchical level schematic representation of a 0/1 bit shifter module 100 comprising four submodules: inverter 150 and multiplexers 120, 130 and 140. As it happens, the design of the multiplexers makes use of feed-through connections, and two types of feed-through are illustrated. Their primary purpose in this case is one of graphical convenience. The "S" input of each multiplexer is replicated at the top of each multiplexer instance. While wires 160, 165, and 170 appear to be separate and unique wires, they are in fact connected in the multiplexer submodules by virtue of a feed-through connection in the module type.

The 0/1 bit shifter module 100 has inputs 102, 104, 106, 108, and 110, labeled "A.3", "A.2", "A.1", "A.0" and "S", respectively. Each label represents an input pin to the module. The module also has outputs 102, 112, 114, and 116, labeled "B.3", "B.2", "B.1", and "B.0", respectively Each labeled output represents an output pin on the module. Note that wire 102 represents both an input (A.3) and an output (B.3) which are directly connected within the module. This is another example of a feed-through pin from the internal perspective. In this case, the purpose of the feed-through pin is a logical convenience, rather than a graphical one. While the signals A.3 and B.3 are logically separate, they are physically the same.

The three instances 120, 130, and 140, of the multiplexer submodules are given the instance names "M2", "M1", and "M0", respectively; and inverter 150 is given an instance name "SEL."

Figure 1B:
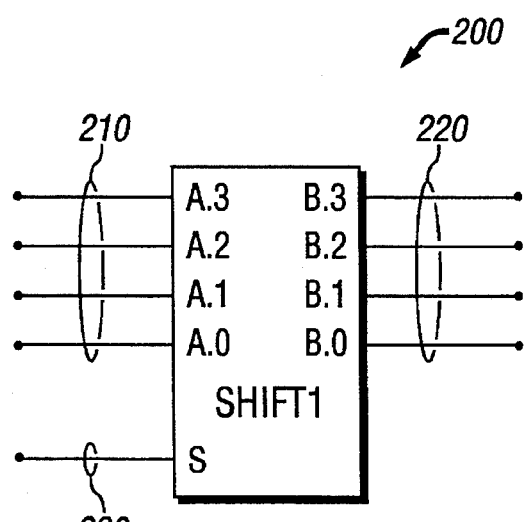

FIG. 1b shows a graphical representation 200 of the module type (e.g., 0/1 bit shifter 100) of FIG. 1a, having four inputs 210 and one input 230 corresponding to the four module inputs 102, 104, 106 and 108, and the one select input 110. In similar manner, with respect to FIG. 1b, graphical module representation 200 also has four outputs 220 corresponding the four outputs 102, 112, 114, and 116 with respect to FIG. 1a. Because of the internal connection of signals A.3 and B.3 in FIG. 1a, two of these same signals in FIG. 1b are connected together physically, even though they are shown on the graphical representation as separate pins. The module type is given the name "SHIFT1".

FIG. 1c shows a higher hierarchical schematic representation of a barrel shifter 300 comprising three instances, 305, 310, and 320, of the 0/1 bit shifter (100,200) of FIGS. 1a and 1b. Again with respect to FIG. 1c, shifter submodules 305 and 310 are interconnected by signals 370; shifter submodules 310 and 320 are interconnected by signals 380. The module has six inputs: four data inputs 330 labeled "A.3", "A.2", "A.1", and "A.0", and two shift select inputs 350 and 360 labeled "R.0" and "R.1", respectively. The module also has four outputs 340 labeled "Z.3", "Z.2", "Z.1", and "Z.0". The three instances 305, 310, and 320 are given instance names "F", "G", and "H", respectively.

FIG. 1d shows a graphical module representation for a module 400, which is the barrel shifter 300 of FIG. 1c. With respect to FIGS. 1c and 1d, inputs 410 correspond to inputs 330; inputs 430 and 440 correspond to inputs 360 and 350, respectively; and outputs 420 correspond to outputs 340. Note that while input A.3 and output Z.3 are shown as logically separate pins, they are connected together two levels of hierarchy below (FIG. 1a). The barrel shifter module 400 is given the name "BARREL4" in FIG. 1d.

FIG. 1e shows a lower hierarchical schematic representation of a module design 500 for a two input multiplexer, of which FIG. 1a shows three instances 120, 130, and 140. Again with respect to FIG. 1e, the module comprises four submodules: NAND gates 510, 520, and 530, and inverter 540. The NAND gate 510 is given an instance name of "PICKA", the NAND gate 520 is given an instance name of "PICKB", the NAND gate 530 is given an instance name of "RES", and the inverter 540 is given an instance name of "SN". Module inputs 550, 555, and 560 are labeled "A", "B", and "S", respectively, and module outputs 575 and 560 are labeled "Z" and "SF", respectively. Note that signal 560 is shown both as an input and an output, connecting two module pins together. This is a feed-through connection, as previously mentioned in the discussion of FIG. 1a.

FIG. 1f shows a graphical representation 600 of the module 500. With respect to FIGS. 1e and 1f, the graphical module representation 600 has an input 610 corresponding to input 550; an input 620 corresponding to input 555; an input 630 and feed-through pin 650 corresponding to signal 560, and an output 640 corresponding to output 575.

FIGS. 2a through 2d show a progressive logical decomposition of the hierarchical design of FIGS. 1a–1f starting at a high level and working down to a lower level bottom level.

Figures 2A, 2B:
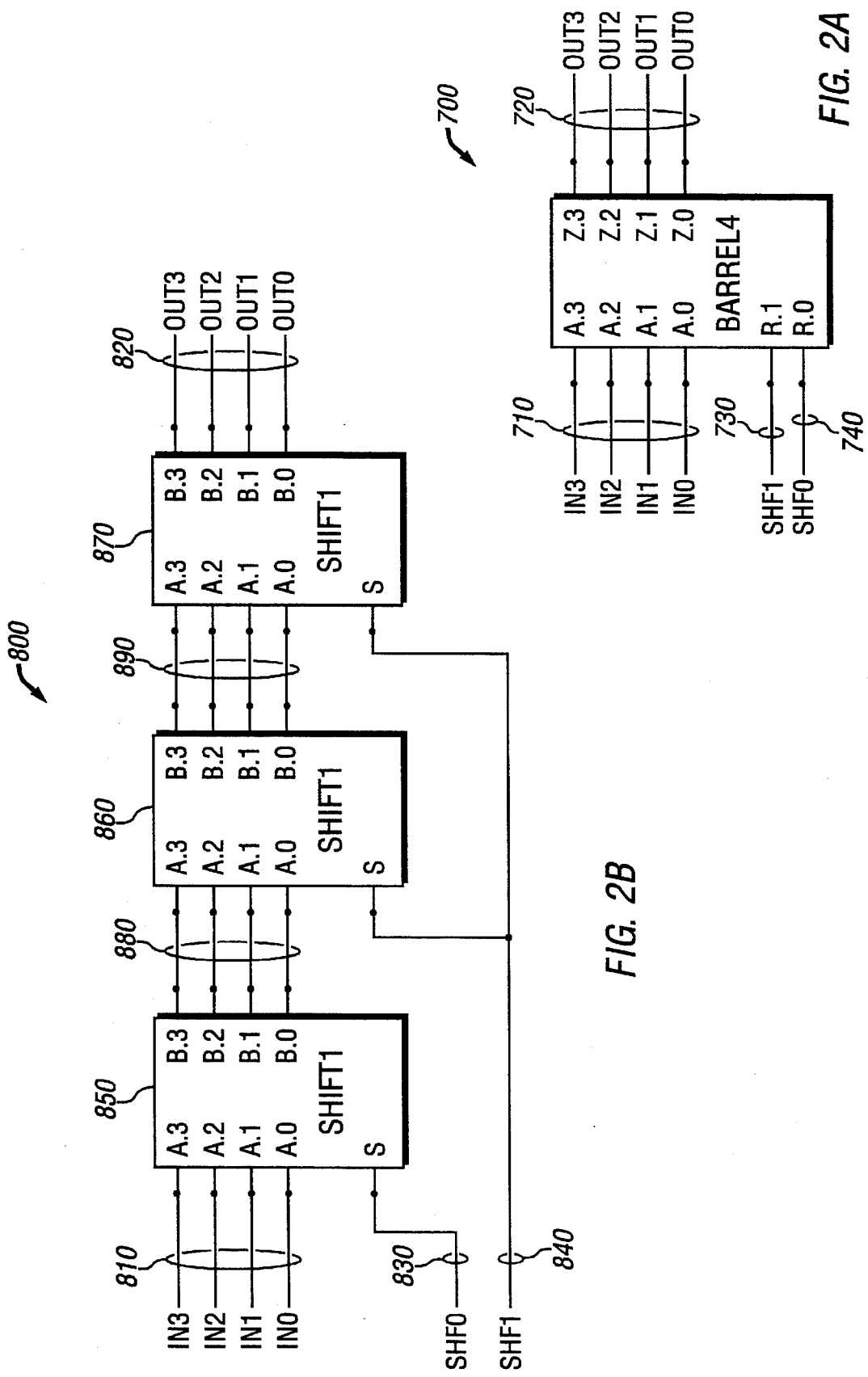
FIGS. 2a–2d are "effective" schematic representations of a top-down progressive expansion (flattening) of the exemplary design shown in FIGS. 1a–1g.

FIG. 2a shows a schematic comprising a single graphical module representation 700 of a 4 bit barrel shifter having a module name of "BARREL4", corresponding to the module 300 and 400 of FIGS. 1c and 1d, respectively. The represented module 700 has four data inputs 710 labeled "A.3", "A.2", "A.1", and "A.0", to which four wires have been connected labeled "IN3", "IN2", "IN1", and "IN0", respectively; four data outputs 720 labeled "Z.3", "Z.2", "Z.1", and "Z.0" to which four wires have been connected labeled "OUT3", "OUT2", "OUT1", and "OUT0"; and two shift count inputs 730 and 740 labeled "R.1" and "R.0", respectively and to which two wires have been connected labeled "SHF1" and "SHF0", respectively.

FIG. 2b shows a schematic representation 800 of the module 700, which has been flattened to the next lower hierarchical level where it can be seen that the equivalent circuit of BARREL4, 800, comprises three instances 850, 860 and 870 of a module named "SHIFT1", corresponding to the module 100 and 200 of FIGS. 1a and 1b, respectively. Inputs 810 correspond to inputs 710 in FIG. 2a. Inputs 830 and 840 correspond to inputs 740 and 730 in FIG. 2a. Outputs 820 correspond to outputs 720 in FIG. 2a. Internal interconnections are made between module 850 and 860 by wires 880 and between modules 860 and 870 by wires 890.

Figure 2C:
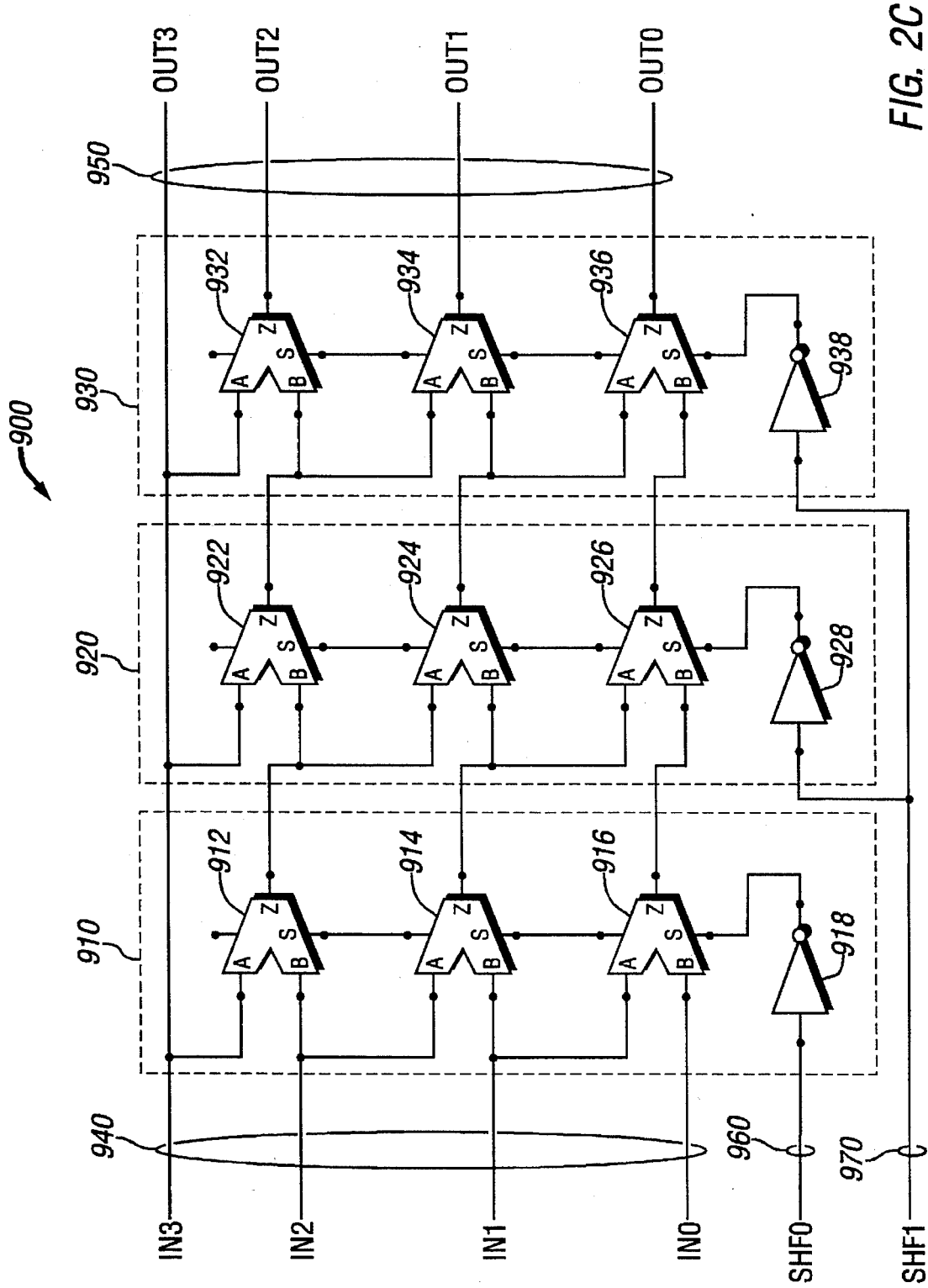

FIG. 2c shows a further flattened representation 900 of the module 800 of FIG. 2b, one hierarchical level further down than shown in FIG. 2b. With respect to FIGS. 2b and 2c, SHIFT1 modules 850, 860, and 870 are expanded to show their submodules and internal connections. Modules within dashed box 910 (i.e., 912, 914, 916, and 918) represent SHIFT1 module 850. Modules 922, 924, 926, and 928 within dashed box 920 represent SHIFT1 module 860. Modules 932, 934, 936, and 938 within dashed box 930 represent SHIFT1 module 870. Inputs 940 correspond to inputs 810; inputs 960 and 970 correspond to inputs 830 and 840, respectively; and outputs 950 correspond to outputs 820. Each SHIFT1 module comprises three multiplexers and one inverter, e.g., in the case of module 910 (corresponding to 850) the three multiplexers are represented by submodules 912, 914, and 916, and the inverter is represented by submodule 918.

Figure 2D:
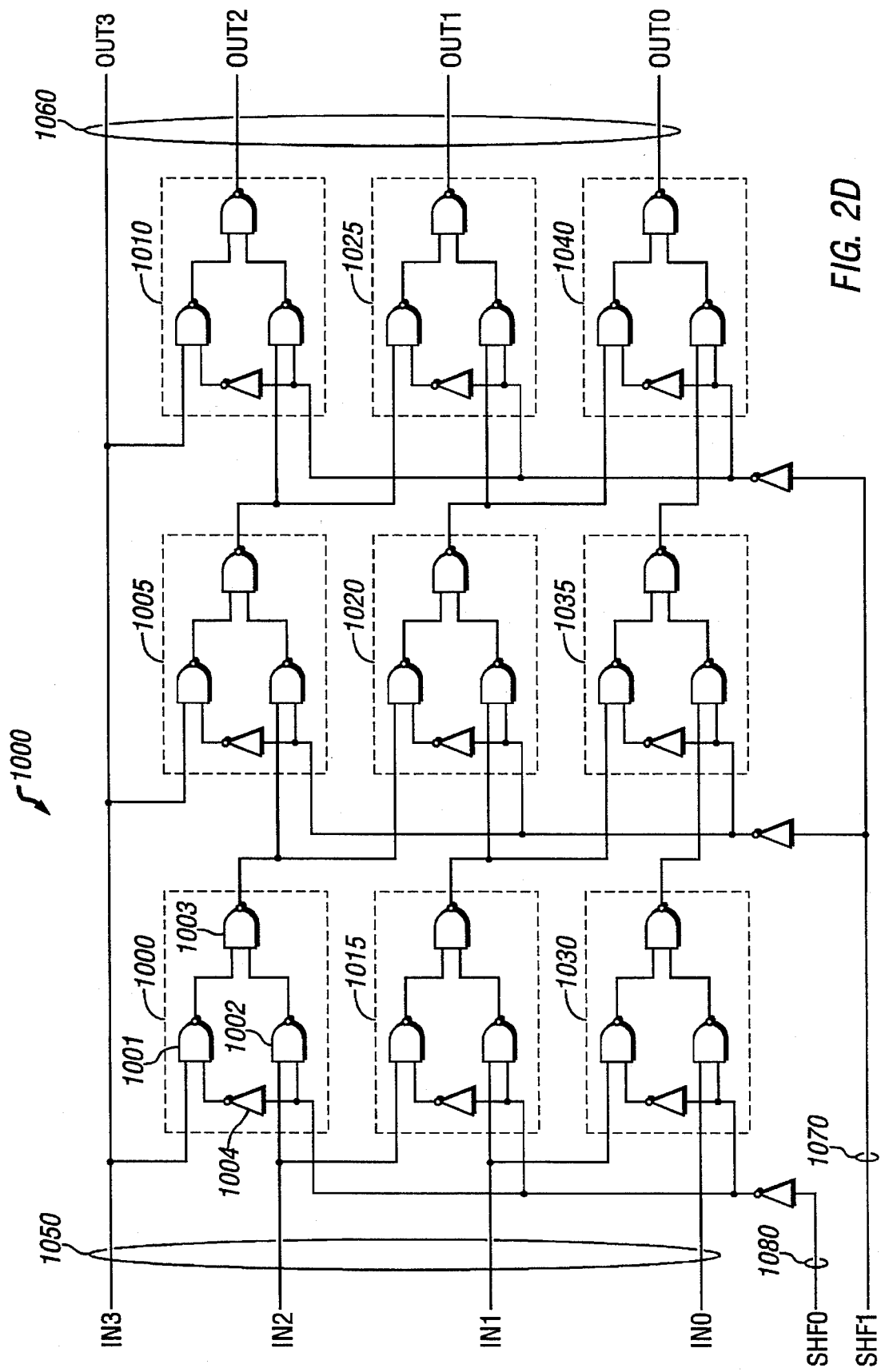

FIG. 2d shows a further flattened representation 1000 of the module 800 of FIG. 2b (900 of FIG. 2c), at the bottom level of the hierarchy, comprising only primitives. With respect to FIGS. 2c and 2d, each multiplexer (i.e., 912, 914, 916, 922, 924, 926, 932, 934, and 936) is replaced with an expanded version (1000, 1015, 1030, 1005, 1020, 1035, 1010, 1025, and 1040, respectively) showing its submodules. Using module 912 as a typical example, module 912 is expanded into module 1000 comprising four submodules: 1001, 1002, 1003, and 1004. Inputs 1050 correspond to inputs 940; inputs 1080 and 1070 correspond to inputs 960 and 970, respectively; and outputs 1060 correspond to outputs 950.

For the following discussion of the present invention, it will be assumed that the hierarchical design of FIGS. 2a–2d has been captured on a ECAD system, and that all information relevant to the design has been loaded into the ECAD system's computer memory, including all module descriptions and interconnection data. While full detail may be available at any given step in the process, details will be shown only as they become relevant to the method of the present invention.

As mentioned hereinabove, the complete flattening process of the present invention comprises nine main steps:

Step 1.

In a first step, represented in FIG. 1g, a top-level module 1100 is created containing the entire hierarchical design, and having no input or output pins. This module will have a module type named "TOP" and an instance name of MAIN. Module type TOP subsumes the entire circuit representation of FIG. 2a, the original top-level schematic. It will also be assumed that the following module type names are in use:

| Module Types | |
|---|---|
| Type Name | Description |
| IV: | Inverter (primitive) |
| ND2: | 2 Input NAND gate (primitive) |
| MUX: | 2 Input Multiplexer (ref. FIG. 1e,1f) |
| SHIFT1: | 0/1 bit Arithmetic Shifter (ref. FIG. 1a,1b) |
| BARREL4: | 4 bit Arithmetic Barrel Shifter (ref. FIG. 1c,1d) |
| TOP | Top level module (ref. FIG. 1g) |

It will also be assumed that the following instance names were used in each module type creation:

| Instances | | |
|---|---|---|
| Module Type | Submodules | Submodule Instance Name |
| TOP | BARREL4 | Barrel |
| BARREL4 | SHIFT1 | F |
|  | SHIFT1 | G |
|  | SHIFT1 | H |
| SHIFT1 | IV | SEL (primitive) |
|  | MUX | M0 |
|  | MUX | M1 |
|  | MUX | M2 |
| MUX | IV | SN |
|  | ND2 | PICKA |
|  | ND2 | PICKB |
|  | ND2 | RES |

It will also be assumed that the following pin names are used for each of the module types:

| Pin Names | |
|---|---|
| Module | Pins |
| IV | A, Z |
| ND2 | A, B, Z |
| MUX | A, B, S, SF, Z |
| SHIFT1 | A.3, A.2, A.1, A.0 |
|  | S |
|  | B.3, B.2, B.1, B.0 |
| BARREL4 | A.3, A.2, A.1, A.0 |
|  | R.1, R.0 |
|  | Z.3, Z.2, Z.1, Z.0 |
| TOP | none |

Finally, it will be assumed that the following nets and net names exist by module type. Note that while some nets may be named by the user, the nets below will be assigned arbitrary sequential names without loss of generality ("Pin:x" refers to the module I/O pin named "x", "name:x" refers to a pin named "x" of the submodule named "name" declared within the module type):

| | | Nets and Net Names | |
|---|---|---|---|
| Module Type | Net Name | Nets(wires) | FIG., Reference# |
| IV | — | — | |
| ND2 | — | — | |
| MUX | NA1 | Pin:A, PICKA:A | FIG. 1e, 550 |
| | NA2 | Pin:B, PICKB:A | FIG. 1e, 555 |
| | NA3 | Pin:S, Pin:SF, PICKB:B, SN:A | FIG. 1e, 560 |
| | NA4 | Pin:Z, RES:Z | FIG. 1e, 575 |
| | NA5 | SN:Z, PICKA:B | FIG. 1e, 580 |
| | NA6 | PICKA:Z, RES:A | FIG. 1e, 565 |
| | NA7 | PICKB:Z, RES:B | FIG. 1e, 570 |
| SHIFT1 | NB1 | Pin:A.3, Pin:B.3, M2:A | FIG. 1a, 102 |
| | NB2 | Pin:A.2, M2:B, M1:A | FIG. 1a, 104 |
| | NB3 | Pin:A.1, M1:B, M0:A | FIG. 1a, 106 |
| | NB4 | Pin:A.0, M0:B | FIG. 1a, 108 |
| | NB5 | Pin:S, SEL:A | FIG. 1a, 110 |
| | NB6 | Pin:B.2, M2:Z | FIG. 1a, 112 |
| | NB7 | Pin:B.1, M1:Z | FIG. 1a, 114 |
| | NB8 | Pin:B.0, M0:Z | FIG. 1a, 116 |
| | NB9 | SEL:Z, M0:S | FIG. 1a, 160 |
| | NB10 | M0:SF, M1:S | FIG. 1a, 165 |
| | NB11 | M1:SF, M2:S | FIG. 1a, 170 |
| BARREL4 | NC1 | Pin:A.3, F:A.3 | FIG. 1c, 330 |
| | NC2 | Pin:A.2, F:A.2 | FIG. 1c, 330 |
| | NC3 | Pin:A.1, F:A.1 | FIG. 1c, 330 |
| | NC4 | Pin:A.0, F:A.0 | FIG. 1c, 330 |
| | NC5 | Pin:R.0, F:S | FIG. 1c, 350 |
| | NC6 | Pin:R.1, G:S, H:S | FIG. 1c, 360 |
| | NC7 | Pin:Z.3, H:B.3 | FIG. 1c, 340 |
| | NC8 | Pin:Z.2, H:B.2 | FIG. 1c, 340 |
| | NC9 | Pin:Z.1, H:B.1 | FIG. 1c, 340 |
| | NC10 | Pin:Z.0, H:Z.0 | FIG. 1c, 340 |
| | NC11 | F:B.3, G:A.3 | FIG. 1c, 370 |
| | NC12 | F:B.2, G:A.2 | FIG. 1c, 370 |
| | NC13 | F:B.1, G:A.1 | FIG. 1c, 370 |
| | NC14 | F:B.0, G:A.0 | FIG. 1c, 370 |
| | NC15 | G:B.3, H:A.3 | FIG. 1c, 380 |
| | NC16 | G:B.2, H:A.2 | FIG. 1c, 380 |
| | NC17 | G:B.1, H:A.1 | FIG. 1c, 380 |
| | NC18 | G:B.0, H:A.0 | FIG. 1c, 380 |
| TOP | ND1 | IN3, BARREL:A.3 | FIG. 2a, 710 |
| | ND2 | IN2, BARREL:A.2 | FIG. 2a, 710 |
| | ND3 | IN1, BARREL:A.1 | FIG. 2a, 710 |
| | ND4 | IN0, BARREL:A.0 | FIG. 2a, 710 |
| | ND5 | SHF1, BARREL:R.1 | FIG. 2a, 730 |
| | ND6 | SHF0, BARREL:R.0 | FIG. 2a, 740 |
| | ND7 | OUT3, BARREL:Z.3 | FIG. 2a, 720 |
| | ND8 | OUT2, BARREL:Z.2 | FIG. 2a, 720 |
| | ND9 | OUT1, BARREL:Z.1 | FIG. 2a, 720 |
| | ND10 | OUT0, BARREL:Z.0 | FIG. 2a, 720 |

It should be noted that all nets are consistent with FIGS. 1a, 1c, and 1e. Nets with a "Pin:x" specification in their list of connections are external nets, because they connect to I/O pins of the module; and nets without a "Pin:x" specification are internal nets, because they are not visible at a higher level. Nets having two or more "Pin:x" specifications represent feed-throughs, and will be examined in step six of the method of the present invention, described in greater detail hereinbelow.

Step 2.

In this step, the entire hierarchy is scanned from top to bottom to determine the level of each type. After this process is complete, the following level assignments will have been made, and recorded.

| Level Assignments | |
|---|---|
| Type | Level |
| TOP | 4 |
| SHIFT1 | 2 |
| MUX | 1 |
| IV | 0 |
| BARREL4 | 3 |
| ND2 | 0 |

No module type is examined more than once. A standard algorithm for levelizing a combinational logic circuit is adapted for this purpose. To find the level of a module, one first finds the level of all module types used in the module for which the level is not yet known. One then takes the largest level of any type used in the module, and adds ONE, giving the level of the module. In this case, it runs as follows:

```
start on TOP
    start on BARREL4
        start on SHIFT1
            start on IV→primitive,∴0
            start on MUX
                IV already computed to be 0
                start on ND2→primitive,∴0
                max is 0 ∴ MUX level = 1
            max is 1 ∴ SHIFT1 level =2
        max is 2 ∴ BARREL4 level =3
    max is 3 ∴ TOP level =4
```

In general, analysis of a module type's level in a hierarchy will be determined in the order that module types are encountered (declared) in the hierarchy, which may or may not be related to its level in the hierarchy. In the case shown above, the order of declaration is not related to hierarchical level.

Step 3.

In this step, all module type descriptions are placed into a list sorted in order of increasing hierarchical level as assigned in Step 2. (The order of module type descriptions in the list at the same hierarchical level is unimportant.) After the third step, the module type descriptions for this example are placed in a list in the following order:

| Module Description List 1 | |
|---|---|
| Module | Level |
| IV | 0 |
| ND2 | 0 |
| MUX | 1 |
| SHIFT1 | 2 |
| BARREL4 | 3 |
| TOP | 4 |

Each module type appears only once in the list. Each entry therefore has no specific instance name or parent.

Step 4.

In this step, the pin connection orders are standardized for all modules of the same type. For example, in the process of creating the design, and depending upon specific data structure creation techniques used by a specific ECAD system, connection lists for module descriptions may be ordered in a haphazard fashion or may have pins referred to by two or more different methods. It is necessary to standardize the order of entry by pin for each module of the same type and to eliminate redundant entries. After the completion of this process, pin orders (which have been arbitrarily chosen for this example) will be as follows (a "parent" is the module type to which a submodule belongs):

| Module Description List 2 | | | | |
|---|---|---|---|---|
| Inst | Type | Level | Parent | Pins |
| SN | IV | 1 | MUX | A<br>Z |
| PICKA | ND2 | 1 | MUX | A<br>B<br>Z |
| PICKB | ND2 | 1 | MUX | A<br>B<br>Z |
| RES | ND2 | 1 | MUX | A<br>B<br>Z |
| SEL | IV | 2 | SHIFT1 | A<br>Z |
| M0 | MUX | 2 | SHIFT1 | A<br>B<br>S<br>SF<br>Z |
| M1 | MUX | 2 | SHIFT1 | A<br>B<br>S<br>SF<br>Z |
| M2 | MUX | 2 | SHIFT1 | A<br>B<br>S<br>SF<br>Z |
| F | SHIFT1 | 3 | BARREL4 | A.3<br>A.2<br>A.1<br>A.0<br>S.<br>B.3<br>B.2<br>B.1<br>B.0 |
| G | SHIFT1 | 3 | BARREL4 | A.3<br>A.2<br>A.1<br>A.0<br>S<br>B.3<br>B.2<br>B.1<br>B.0 |
| H | SHIFT1 | 3 | BARREL4 | A.3<br>A.2<br>A.1<br>A.0<br>S<br>B.3<br>B.2<br>B.1<br>B.0 |
| BARREL | BARREL4 | 4 | TOP | A.3<br>A.2<br>A.1<br>A.0<br>R.1<br>R.0<br>Z.3<br>Z.2<br>Z.1<br>Z.0 |
| MAIN | TOP | none | none | none |

This operation is done one parent at a time, in order of the parent's level (rather than in order of the submodule's level).

As illustrated above, the order of pins for modules of the same type is identical.

Step 5.

In this step, all global references in the module description list are resolved. That is, any global signal used by a submodule is moved up the hierarchy and added to the list of global signals used by the module containing it (its "parent" module), if it is not already in the list. The hierarchy is processed from bottom to top (i.e., level 0 up) so that at the end, any module's global signal list will reflect all of the global signals in use by all of its submodules. (This example does not use any global signals.) The module description list will contain the following after this step:

Module Description List 3

| Module | Level | Pins |
|---|---|---|
| IV | 0 | |
| | | A |
| | | Z |
| ND2 | 0 | |
| | | A |
| | | B |
| | | Z |
| MUX | 1 | |
| | | A |
| | | B |
| | | S |
| | | SF |
| | | Z |
| SHIFT1 | 2 | |
| | | A.3 |
| | | A.2 |
| | | A.1 |
| | | A.0 |
| | | S |
| | | B.3 |
| | | B.2 |
| | | B.1 |
| | | B.0 |
| BARREL4 | 3 | |
| | | A.3 |
| | | A.2 |
| | | A.1 |
| | | A.0 |
| | | R.1 |
| | | R.0 |
| | | Z.3 |
| | | Z.2 |
| | | Z.1 |
| | | Z.0 |
| TOP | 4 | |
| | | none |

Step 6.

In this step, the net list (wire list) is now altered according to detection of internal nets of submodules which connect two pins together (i.e., feed-throughs). Feed-throughs are eliminated by deleting all but one of the "shorted" wires at the higher level and moving all connections of the deleted wires to the remaining wire, less the redundant pin connection. In like manner, global connections are passed up the hierarchy such that at the end of this step, each submodule pin and global connection is associated with an internal or external wire or global reference. The resultant altered net-list will contain the following information. (offsets are specified within the submodule description, for all internal nets):

Altered Net-List

| Type | Name | Offset | Nets(wires) |
|---|---|---|---|
| IV | — | — | none (primitive) |
| ND2 | — | — | none (primitive) |
| MUX | NA1 | | Pin:A, PICKA:A |
| | NA2 | | Pin:B, PICKB:A |
| | NA3 | | Pin:S, Pin:SF, PICKB:B, SN:A |
| | NA4 | | Pin:Z, RES:Z |
| | NA5 | 0 | SN:Z, PICKA:B |
| | NA6 | 1 | PICKA:Z, RES:A |
| | NA7 | 2 | PICKB:Z, RES:B |
| SHIFT1 | NB1 | | Pin:A.3, Pin:B.3, M2:A |
| | NB2 | | Pin:A.2, M2:B, M1:A |
| | NB3 | | Pin:A.1, M1:B, M0:A |
| | NB4 | | Pin:A.0, M0:B |
| | NB5 | | Pin:S, SEL:A |
| | NB6 | | Pin:B.2, M2:Z |
| | NB7 | | Pin:B.1, M1:Z |
| | NB8 | | Pin:B.0, M0:Z |
| | NB9 | 0 | SEL:Z, M0:S, M1:S, M2:S |
| BARREL4 | NC1 | | Pin:A.3, Pin:Z.3, F:A.3, G:A.3, H:A.3 |
| | NC2 | | Pin:A.2, F:A.2 |
| | NC3 | | Pin:A.1, F:A.1 |
| | NC4 | | Pin:A.0, F:A.0 |
| | NC5 | | Pin:R.0, F:S |
| | NC6 | | Pin:R.1, G:S, H:S |
| | NC8 | | Pin:Z.2, H:B.2 |
| | NC9 | | Pin:Z.1, H:B.1 |
| | NC10 | | Pin:Z.0, H:Z.0 |
| | NC12 | 0 | F:B.2, G:A.2 |
| | NC13 | 1 | F:B.1, G:A.1 |
| | NC14 | 2 | F:B.0, G:A.0 |
| | NC16 | 3 | G:B.2, H:A.2 |
| | NC17 | 4 | G:B.1, H:A.1 |
| | NC18 | 5 | G:B.0, H:A.0 |
| TOP | ND1 | 0 | IN3, OUT3, BARREL:A.3 |
| | ND2 | 1 | IN2, BARREL:A.2 |
| | ND3 | 2 | IN1, BARREL:A.1 |
| | ND4 | 3 | IN0, BARREL:A.0 |
| | ND5 | 4 | SHF1, BARREL:R.1 |
| | ND6 | 5 | SHF0, BARREL:R.0 |
| | ND8 | 6 | OUT2, BARREL:Z.2 |
| | ND9 | 7 | OUT1, BARREL:Z.1 |
| | ND10 | 8 | OUT0, BARREL:Z.0 |

As shown, alterations have been made to SHIFT1, BARREL4 and TOP net lists to account for feed-through connections (specifically, elimination of nets NB10, NB11, NC7, NC11, NC15, and ND7), and the associated elimination of redundant pin connections (specifically, elimination of MUX:SF, SHIFT1:B.3, and BARREL4:Z.3 pin connections).

Step 6, in which pins and internal wires that are connected together are identified, is the most complex step in the flattening method of the present invention. Its basic purpose is to produce a list of internal and external wires for each module type, and to specify which of these wires is connected to each I/O pin and subcomponent pin. If the ECAD system did not allow two or more I/O pins of a module type to be wired together inside that module, this step would be less significant, but such a restriction would be a serious weakness in the ECAD system. This is to be distinguished from the case in which two pins are wired together in an enclosing module. That case is also handled by Step 6, when it operates on the enclosing module. In this discussion, references to I/O pins of a subcomponent should be understood to also include global signals accessed by the subcomponent from definitions in the current module or higher level modules. Since whether two pins of a module are wired together can depend on whether two pins of one of its subcomponents are wired together, it is important to run Step 6 on all of the subcomponent types used in a module type before working on that module type. This is guaranteed by running it on all module types at one hierarchical level prior running it on module types at the next higher level.

In this example, by way of preferred embodiment of the invention, Step 6 consists of performing the following steps 6(a) . . . (k) on each module type.

(a) Count the wires in the module description. Create an array of integers (named "INDICES") with that many elements. Set each element of the array to its own position in the array (i.e., element zero is set to zero, element one is set to one, etc.).

(b) Count the I/O pins of each subcomponent. Attach that number to the record for the subcomponent. Add up the numbers to find the total number of connections to subcomponents. Create an array of integers (named "PINS") with that many elements. Set all of the elements to −1.

(c) For each I/O pin of each subcomponent, find the wire in the module description that it is connected to, allocate a position in the PINS array, and store the ID number of the wire into the allocated position in the pin array. The ID number of the wire is simply its position in the module description's list of wires. The module description specifies to which wire each subcomponent I/O pin is connected.

(d) One of the results of performing these steps (6a–6k) on a module type is a table which specifies which I/O pins are wired together inside that module. This table is in the form of an array of integers (named "IOS"), with one entry for each I/O pin. The number in the array position for a given I/O pin is the same as the position in the array, unless that I/O pin is wired to another pin of the same module. If it is wired to such a pin, the number in its array position is the position of that pin. If three or more pins are wired together, their positions in the IOS array are linked in a circular list.

For each I/O pin of each subcomponent, its position is found in the IOS array of the module type of the subcomponent. (This table has been created already because the module types are processed in the correct order.) If the number in that position in the IOS array is not equal to the position, the pins corresponding to the position and the number found in the position are wired together. The ID numbers of the signals connected to the two pins are looked up in the PINS array. The ID number of one is placed in the position corresponding to the other in the INDICES array. This assumes that neither signal has already had this function performed on it—if it has, the operation is more complex. The purpose of this is that the INDICES array maps all signals that have been wired together to a single signal.

(e) At this point, all signals wired together can be traced to a common signal through the INDICES array by repeatedly going from a given position to the position specified at that position in the array until a position containing its own index is found. This step modifies the INDICES array so that this can be done for each signal in one step, instead of in several steps. Hence, for example, if signals "1", "2" and "3" are wired together, the INDICES array will contain the same number (e.g. "1") in all three positions.

(f) There will now be a unique number for each electrically connected set of wires. These numbers are copied into the PINS array elements so that each subcomponent I/O pin points at the wire to which it is connected. The numbers are also copied into the module description wire list, so that each wire's ID number is changed to that of the different wire it is connected to, if any.

(g) There will now be two types of wires: those that are marked as equivalent to another wire, and those that are not. Exactly one wire in a group of equivalent wires is not so marked, and the others in the group point to it. An unmarked wire is recognized by having its own position in its position in the INDICES array. These wires are counted. The result is the number of distinct internal and external wires in the module. These wires are then renumbered, starting at zero. The marked wires are ignored from this point onward. The wire ID numbers and the elements of the PINS array are changed again to reflect the renumbering. At this point, the information in the INDICES array is no longer important. It is now cleared by filling each element with −1.

(h) An IOS array like the ones used in Step 6(d), above, is now created for the current module. It will be used when Step 6(d) is run on higher level modules. It is an array of integers with one element for each I/O pin of the module. All elements are initialized to −1.

(i) The pin number of each module I/O pin is inserted in the INDICES array in the position specified by the ID number of the wire to which that I/O pin is connected. If two or more I/O pins are connected to the same wire, the INDICES array element contains the pin number of the first one. The IOS array elements at the positions corresponding to all of the module I/O pins connected to the same wire are linked together in a circular chain. For example, if pins "2", "3" and "5" are all connected to wire "6", IOS[2]=5, IOS[5]=3, and IOS[3]=2. As each pin is processed, the INDICES array element of the wire connected to that pin is used to find any other pins that are also connected to that wire.

(j) The INDICES array now contains a value of −1 for all internal wires and the I/O pin number of a pin for all external wires. The internal wires are counted, and the INDICES array is stepped through, setting the elements for internal wires to successive positive integers and adding a large constant such as one billion to the elements for external wires. This step allocates relative positions to all of the internal wires of the module. The large constant is added simply so that external wires can still be distinguished from internal wires, by having numbers greater to or equal to that of the constant. (It is assumed that no module has more than one billion internal wires.)

(k) The change to the INDICES array performed in Step 6(j) constitutes another renumbering of the module's wires. The new numbering must again be propagated to the wire ID numbers and to the PINS array. The PINS array will now contain the information needed in Step 9 (below) to connect instantiated subcomponent pins to the correct instantiated wires. The PINS array is saved in the module description data structure.

Step 7.

In this step, the number of internal wires (internal signals), submodules, and submodule pins directly or indirectly contained in each module type is counted (computed). Totalizing is based on the previous analysis. This is all accomplished by traversing the hierarchy of module types from bottom to top. The process is illustrated in the table, below, and also in FIG. 3. The results are as follows, in order of calculation.

In FIG. 3, there is shown a "reduced" hierarchical arrangement 1200 of the Barrel Shifter described in FIGS. 1a–f and 2a–e. Various "bookkeeping" numbers n1 . . . n7 are shown. The numbers n1 . . . n4 relate to current "counts" for the present module (direct), and the numbers n5 . . . n7 relate to cumulative totals for the present module and all lower modules (direct and indirect). More particularly:

n1 is the number of pins in a module (direct);

n2 is the number of internal signals in the module (direct);

n3 is the number of submodules contained in the module (direct);

n4 is the number of submodule pins contained in the module (direct);

n5 is the cumulative total of submodules contained in the module (direct and indirect);

n6 is the cumulative total of submodule pins (direct and indirect); and n7 is the cumulative total of internal signals (direct and indirect).

"n1" through "n4" are computed in Step 6. "n5" through "n7" are computed in Step 7 on the basis of "n1" through "n3". "n4" is the size of the PINS array created in Step 6, and is not used in Step 7.

There are two "primitives" at level 0—an IV 1202 (corresponding to the inverter 540 of FIG. 1e and 150 of FIG. 1a) and a NAND gate 1204 (corresponding to the NAND gates 510, 520 and 530 of FIG. 1e).

The inverter 1202 is a module, and has two pins—named "A" and "Z". The module 1202 has the following module "counts", n1 . . . n4: n1=2 pins, n2=0 internal signals (it is a primitive), contains n3=0 submodules, and has n4=0 submodule pins.

The cumulative totals n5–n7 at this stage are: n5=0 submodules; n6=2 pins (direct) and submodule pins (indirect); and n7=0 internal wires (direct and indirect). Evidently, n5=n3, n6=n1, and n7=n2, at this stage.

Moving to the next level of the reduced hierarchical arrangement, at level 0 there is also a NAND gate 1204, which has module counts of: n1=3 pins—named "A", "B" and "Z"; n2=0 internal signals; n3=0 submodules; and n4=0 submodule pins.

The cumulative totals at this stage are: n5=0 submodules; n6=3 submodule pins; and n7=0 internal wires. Evidently, n5=n3, n6=n1, and n7=n2, at this stage.

At level 1, there appears a MUX module 1206. From FIG. 1a, we know that there will be three instances of MUX (M2, M1, M0) for each SHIFT1, and from FIG. 1c we know that there will be three instances of SHIFT1 (for the BARREL module). For MUX 1206, there are: n1=5 pins (A,B,S,SF,Z); n2=3 internal signals (SN/Z, PICKA/Z, PICKB/Z); n3=4 submodules (PICKA, PICKB, RES, SN, see FIG. 1e); and n4=11 submodule pins.

The cumulative totals at the level of the MUX 1206 are: n5=4 submodules; n6=16 submodule pins; and n7=3 internal wires.

At level 2, there appears a SHIFT1 module 1208. From FIGS. 1a and 1e we know that each instance of SHIFT1 contains four submodules (M2,M1,M0, SEL). For SHIFT1, there are: n1=9 pins (A3, A2, A1, A0, S, B3, B2, B1, B0); n2=1 internal signals; n3=4 submodules (SEL,M0,M1,M2); and n4=17 submodule pins.

The cumulative totals at this level (present module) are: n5=16, n6=59 and n7=10.

At level 3, showing the BARREL module 1210 (see 400, FIG. 1d), the counts are: n1=10, n2=6, n3=3 and n4=27. The cumulative totals (present module) are: n5=51, n6=187 and n7=36, calculated as follows:

$n5$(present module)=[$n5$(SHIFT1 submodule)·3 instances+ $n3$(present module)];

$n6$(present module)=[$n6$(SHIFT1 submodule)×3 instances+ $n1$(present module); and $n7$(present module)=[$n7$(SHIFT1 submodule)×3 instances+ $n2$(present module).

At level 4 is the TOP module 1212, which was created in step 1 (see FIG. 1g). The counts are: n1=0 (by definition), n2=9, n3=1, and n4=10. The cumulative totals (present module) are: n5=52 (n5,submodule, plus n3, present), n6=187 (same as n6, submodule) and n7=45 (n7, submodule, plus n2, present).

The "Counts and Totals" table, below, and FIG. 3 present the counts and totals.

Thus, it can be seen, in the reduced hierarchical arrangement, that:

| | Counts and Totals | | | | | | |
|---|---|---|---|---|---|---|---|
| Level | n1 | n2 | n3 | n4 | n5 | n6 | n7 |
| 0 (IV) | 2 | 0 | 0 | 0 | 0 | 2 | 0 |
| 0 (ND2) | 3 | 0 | 0 | 0 | 0 | 3 | 0 |
| 1 (MUX) | 5 | 3 | 4 | 11 | 4 | 16 | 3 |
| 2 (SHIFT1) | 9 | 1 | 4 | 17 | 16 | 59 | 10 |
| 3 (BARREL) | 10 | 6 | 3 | 27 | 51 | 187 | 36 |
| 4 (TOP) | 0 | 9 | 1 | 10 | 52 | 187 | 45 |

The counts n5, n6 and n7 are calculated by starting them at n3, n1 and n2, respectively, and then looping over all submodules of the present module, and adding in their values for n5, n6 and n7. At each subcomponent, there therefore exists the partial sum for n5, n6 and n7 that does not yet include the current submodule or those after it. These partial sums are written to the record for each subcomponent. They are the offsets that specify the relative location of each item in the final flat design.

The partial sums are shown for the SHIFT1 module in FIG. 3. The partial sums for n5 are 4, 4, 8 and 12. For n6 they are 9, 11, 27 and 43. For n7 they are 1, 1, 4 and 7. For the sake of a procedural simplification in Step 9, it is most convenient to base the n5 partial sums starting at the relative positions of the submodules they are attached to. Therefore, successive integers are subtracted from those values. So the actual offsets are 4–0=4, 4–1=3, 8–2=6 and 12–3=9. This transformation does not apply to the n6 and n7 values.

The counting and totaling in this step is the key to pre-planning memory allocation for the flattened representation (Step 8), and to placement of instances in the flattened representation (Step 9).

Step 8.

In this step, memory is allocated for a flattened data structure to be created which will include arrays of module instances, pin instances, and wire instances. In Step 7, above, appropriate counts were provided for each array element type (i.e., module instance, pin instance, and wire instance). In the calculations for module "TOP", these counts need only be multiplied by the known allocation size for each array element type and added together to get the total size of the memory allocation required.

Memory can be allocated in one large block or in three blocks, one block for each array. The difference between one segment and three is very small. However, the difference between one (or three) segments and several thousand segments can make a noticeable difference in the execution time.

Step 9.

In this step, the circuit is flattened by the recursive algorithm described hereinabove. The resulting instance arrays will contain the following information (Module instance array is shown hierarchically as a notational convenience; actual array is linear, number at left indicates actual array index):

| Module Instance Array | |
|---|---|
| No. | Instance(s) |
| 0: | BARREL.1 |
| 1: | F.1    G.1    H.1 |
| 4: | SEL.1    M0.1    M1.1    M2.1 (submodules of F) |
| 8: | SN.1.1    PICKA.1.1    PICKB.1.1    RES.1.1 |
| 12: | SN.1.2    PICKA.1.2    PICKB.1.2    RES.1.2 |
| 16: | SN.1.3    PICKA.1.3    PICKB.1.3    RES.1.3 |
| 20: | SEL.2    M0.2    M1.2    M2.2 (submodules of G) |
| 24: | SN.2.1    PICKA.2.1    PICKB.2.1    RES.2.1 |
| 28: | SN.2.2    PICKA.2.2    PICKB.2.2    RES.2.2 |
| 32: | SN.2.3    PICKA.2.3    PICKB.2.3    RES.2.3 |
| 36: | SEL.3    M0.3    M1.3    M2.3 (submodules of H) |
| 40: | SN.3.1    PICKA.3.1    PICKB.3.1    RES.3.1 |
| 44: | SN.3.2    PICKA.3.2    PICKB.3.2    RES.3.2 |
| 48: | SN.3.3    PICKA.3.3    PICKB.3.3    RES.3.3 |

| Internal Wire Instance Array | | |
|---|---|---|
| No: | Connections | |
| 0 | IN3, OUT3, BARREL.1:A.3, BARREL.1:Z.3 | *TOP* |
| 1 | IN2, BARREL.1:A.2 | |
| 2 | IN1, BARREL.1:A.1 | |
| 3 | IN0, BARREL.1:A.0 | |
| 4 | SHF1, BARREL.1:R.1 | |
| 5 | SHF0, BARREL.1:R.0 | |
| 6 | OUT2, BARREL.1:Z.2 | |
| 7 | OUT1, BARREL.1:Z.1 | |
| 8 | OUT0, BARREL.1:Z.0 | |
| 9 | F.1:B.2, G.1:A.2 | *BARREL.1* |
| 10 | F.1:B.1, G.1:A.1 | |
| 11 | F.1:B.0, G.1:A.0 | |
| 12 | G.1:B.2, H.1:A.2 | |
| 13 | G.1:B.1, H.1:A.1 | |
| 14 | G.1:B.0, H.1:A.0 | |
| 15 | SEL.1:Z, M0.1:S, M1.1:S, M2.1:S | *F.1* |
| 16 | SN.1.1:Z, PICKA.1.1:B | *M0.1* |
| 17 | PICKA.1.1:Z, RES.1.1:A | |
| 18 | PICKB.1.1:Z, RES.1.1:B | |
| 19 | SN.1.2:Z, PICKA.1.2:B | *M1.1* |
| 20 | PICKA.1.2:Z, RES.1.2:A | |
| 21 | PICKB.1.2:Z, RES.1.2:B | |
| 22 | SN.1.3:Z, PICKA.1.3:B | *M2.1* |
| 23 | PICKA.1.3:Z, RES.1.3:A | |
| 24 | PICKB.1.3:Z, RES.1.3:B | |
| 25 | SEL.2:Z, M0.2:S, M1.2:S, M2.2:S | *G.1* |
| 26 | SN.2.1:Z, PICKA.2.1:B | *M0.2* |
| 27 | PICKA.2.1:Z, RES.2.1:A | |
| 28 | PICKB.2.1:Z, RES.2.1:B | |
| 29 | SN.2.2:Z, PICKA.2.2:B | *M1.2* |
| 30 | PICKA.2.2:Z, RES.2.2:A | |
| 31 | PICKB.2.2:Z, RES.2.2:B | |
| 32 | SN.2.3:Z, PICKA.2.3:B | *M2.2* |
| 33 | PICKA.2.3:Z, RES.2.3:A | |
| 34 | PICKB.2.3:Z, RES.2.3:B | |
| 35 | SEL.3:Z, M0.3:S, M1.3:S, M2.3:S | *H.1* |
| 36 | SN.3.1:Z, PICKA.3.1:B | *M0.3* |
| 37 | PICKA.3.1:Z, RES.3.1:A | |
| 38 | PICKB.3.1:Z, RES.3.1:B | |
| 39 | SN.3.2:Z, PICKA.3.2:B | *M1.3* |
| 40 | PICKA.3.2:Z, RES.3.2:A | |
| 41 | PICKB.3.2:Z, RES.3.2:B | |
| 42 | SN.3.3:Z, PICKA.3.3:B | *M2.3* |
| 43 | PICYA.3.3:Z, RES.3.3:A | |
| 44 | PICKB.3.3:Z, RES.3.3:B | |

| Pin Instance Array | | | |
|---|---|---|---|
| No: | Parent | Name | Wire |
| 0 | BARREL.1 | A.3 | 0 |
| 1 | BARREL.1 | A.2 | 1 |
| 2 | BARREL.1 | A.1 | 2 |
| 3 | BARREL.1 | A.0 | 3 |
| 4 | BARREL.1 | R.1 | 4 |
| 5 | BARREL.1 | R.0 | 5 |
| 6 | BARREL.1 | Z.3 | 0 |
| 7 | BARREL.1 | Z.2 | 6 |
| 8 | BARREL.1 | Z.1 | 7 |
| 9 | BARREL.1 | Z.0 | 8 |
| 10 | F.1 | A.3 | 0 |
| 11 | F.1 | A.2 | 1 |
| 12 | F.1 | A.1 | 2 |
| 13 | F.1 | A.0 | 3 |
| 14 | F.1 | S | 5 |
| 15 | F.1 | B.3 | 0 |
| 16 | F.1 | B.2 | 9 |
| 17 | F.1 | B.1 | 10 |
| 18 | F.1 | B.0 | 11 |
| 19 | G.1 | A.3 | 0 |
| 20 | G.1 | A.2 | 9 |
| 21 | G.1 | A.1 | 10 |
| 22 | G.1 | A.0 | 11 |
| 23 | G.1 | S | 4 |
| 24 | G.1 | B.3 | 0 |
| 25 | G.1 | B.2 | 12 |
| 26 | G.1 | B.1 | 13 |
| 27 | G.1 | B.0 | 14 |
| 28 | H.1 | A.3 | 0 |
| 29 | H.1 | A.2 | 12 |
| 30 | H.1 | A.1 | 13 |
| 31 | H.1 | A.0 | 14 |
| 32 | H.1 | S | 4 |
| 33 | H.1 | B.3 | 0 |
| 34 | H.1 | B.2 | 6 |
| 35 | H.1 | B.1 | 7 |
| 36 | H.1 | B.0 | 8 |
| 37 | SEL.1 | A | 5 |
| 38 | SEL.1 | Z | 15 |
| 39 | M0.1 | A | 2 |
| 40 | M0.1 | B | 3 |
| 41 | M0.1 | S | 15 |
| 42 | M0.1 | SF | 15 |
| 43 | M0.1 | Z | 11 |
| 44 | M1.1 | A | 1 |
| 45 | M1.1 | B | 2 |
| 46 | M1.1 | S | 15 |
| 47 | M1.1 | SF | 15 |
| 48 | M1.1 | Z | 10 |
| 49 | M2.1 | A | 0 |
| 50 | M2.1 | B | 1 |
| 51 | M2.1 | S | 15 |
| 52 | M2.1 | SF | 15 |
| 53 | M2.1 | Z | 9 |
| 54 | SN.1.1 | A | 15 |
| 55 | SN.1.1 | Z | 16 |
| 56 | PICKA.1.1 | A | 2 |
| 47 | PICKA.1.1 | B | 16 |
| 58 | PICKA.1.1 | Z | 17 |
| 59 | PICKB.1.1 | A | 3 |
| 60 | PICKB.1.1 | B | 15 |
| 61 | PICKB.1.1 | Z | 18 |
| 62 | RES.1.1 | A | 17 |
| 63 | RES.1.1 | B | 18 |
| 64 | RES.1.1 | Z | 11 |
| 65 | SN.1.2 | A | 15 |
| 66 | SN.1.2 | Z | 19 |
| 67 | PICKA.1.2 | A | 1 |
| 68 | PICKA.1.2 | B | 19 |
| 69 | PICKA.1.2 | Z | 20 |
| 70 | PICKB.1.2 | A | 2 |
| 71 | PICKB.1.2 | B | 15 |
| 72 | PICKB.1.2 | Z | 21 |
| 73 | RES.1.2 | A | 20 |
| 74 | RES.1.2 | B | 21 |

-continued

| | | | |
|---|---|---|---|
| 75 | RES.1.2 | Z | 10 |
| 76 | SN.1.3 | A | 15 |
| 77 | SN.1.3 | Z | 22 |
| 78 | PICKA.1.3 | A | 0 |
| 79 | PICKA.1.3 | B | 22 |
| 80 | PICKA.1.3 | Z | 23 |
| 81 | PICKB.1.3 | A | 1 |
| 82 | PICKB.1.3 | B | 15 |
| 83 | PICKB.1.3 | Z | 24 |
| 84 | RES.1.3 | A | 23 |
| 85 | RES.1.3 | B | 24 |
| 86 | RES.1.3 | Z | 9 |
| 87 | SEL.2 | A | 4 |
| 88 | SEL.2 | Z | 25 |
| | etc... | | |

The remainder of the wire instance table continues on in similar fashion.

Figure 4:
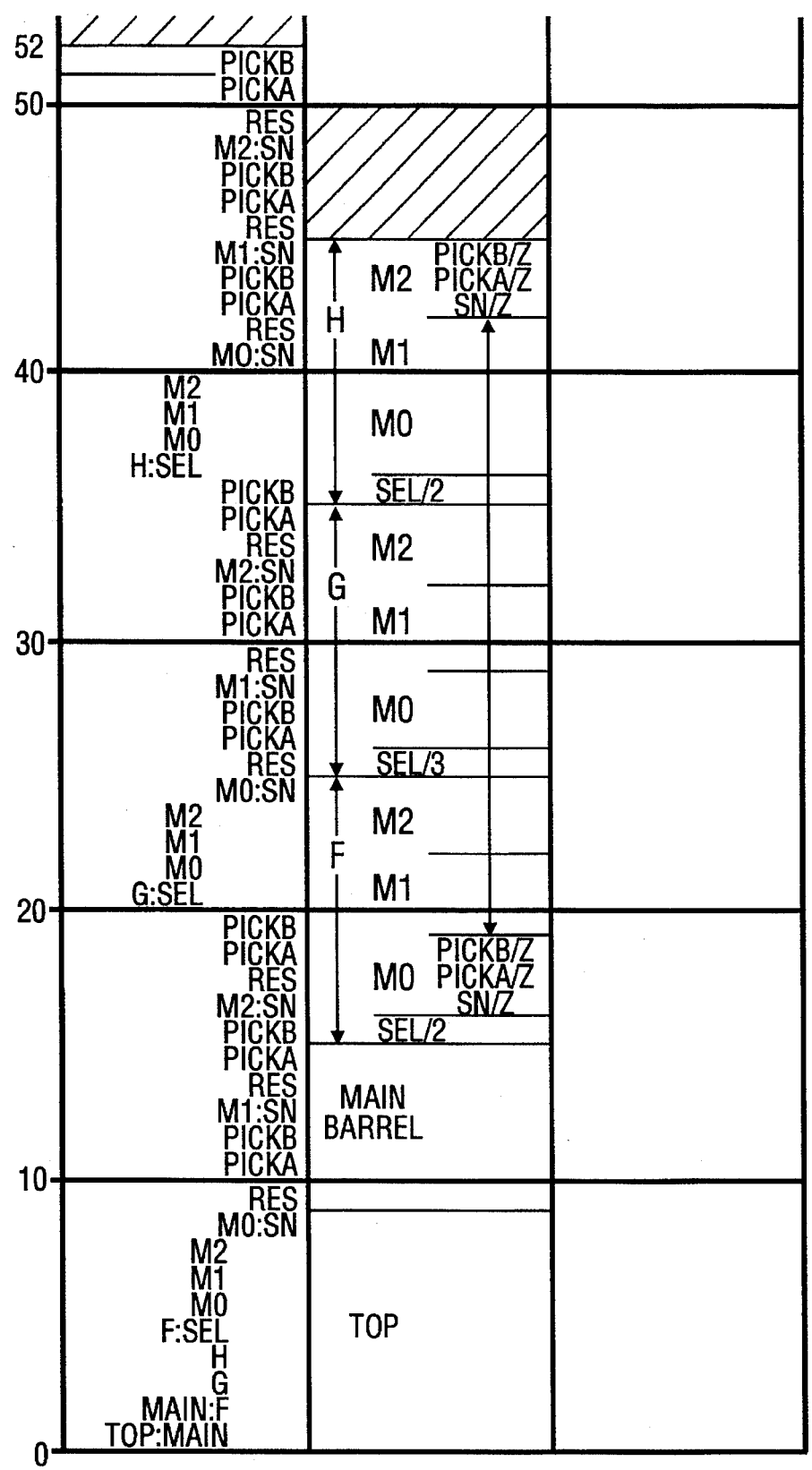
FIG. 4 is a representation of a memory map for the flattened, simulable representation of the design of FIGS. 1a–1g and 2a–2d.

FIG. 4 is a data diagram representing the structure of the flattened design, corresponding to the first two tables of instance arrays set forth above. (The pin instance array was omitted because of its size.)

While it is possible to simply flatten the structure, eliminating any and all traces of hierarchy and reducing the design to a group of interconnected primitives, this would eliminate much traceback information which is essential to the designer in relating primitives to their original place in the hierarchy. Without this information, another means of on-line cross-referencing of the flat structure and the hierarchy would be required. In the sample design, this would amount to discarding FIGS. 2a–2c, and keeping only FIG. 2d.

In the present invention, the hierarchical history is preserved.

It is possible to transform the recursive flattening routing into an equivalent non-recursive routine by standard program transformation techniques. This would make the routine slightly faster, but the code would be harder to understand.

The invention has been described in the context of an electronic circuit, but is more broadly applicable to the flattening of any hierarchical structure. In general terms, a hierarchical design including a plurality of modules, submodules and primitives is methodically rearranged, and a top-level module is created. Attributes for each module, submodule and primitive are re-ordered in a consistent manner, and certain parameters are propagated up to the top-level module. The attributes for each module, submodule and primitive are counted, and totalized from the bottom up. Partial sums are attached to each submodule to record its relative position in the flat structure. Based on the totalized attribute count, memory is allocated prior to flattening. A flattening routine is applied recursively to the design. This routine uses the information computed in earlier steps to simplify operations performed on each component of the flat structure, thus allowing the flattening algorithm to run very quickly.

APPENDIX

Appended hereto, and forming part of the disclosure, is a 22 page document including code listing and comments.

APPENDIX

```c
/*
        pfind.h

Definitions for findparts()..
*/ define pardf_x struct paraREC *
define subco_x struct subaREC * include "pardef.h"

typedef char *string;

typedef struct paraREC {
    pardf type;
    int hlevel, color, nio, nsigs, nintsig, nsubio, nsubmod;
    int nkept;
    int *ios;
    int *subios;
    int *sigids;
    int *pinmap;
    int totsigs, totpins, totmods;
} pararec, *para;

typedef struct subaREC {
    subco mod;
    int pos, nio, idnum;
    int map;
    int pinoff, sigoff, modoff;
} subarec, *suba;

typedef struct {
    string partname, pinname;
} keyrec;

/***************** External Declarations *****************/ extern pardf findparts();
extern hash_table hashpintype();
```

```
/*
        pfind.c

Routines for finding and loading all required part definitions.

pardf findparts(part_name)
        hash_table hashpintype(part_list, pin_type)  --

*/ include <stdio.h>
include "lsigpal.h"
#include "libdef.h"
#include "lsinhsh.h"
#include "pfind.h"

#define loop_over_list(p, lis) for (p = lis; p != NULL; p = p->next)
#define new(ty) (ty *) qalloc(sizeof(ty), memgp)
#define new_array(n, ty) (ty *) qalloc((n) * sizeof(ty), memgp)
/****************** Variables ******************************/ memory_group memgp;

static LIBRARY **libs;
static hash_table typetab, inpintab, outpintab;
static pardf curp;
static pardf top, plist;
static string phonyargs[] = { NULL };

extern string sstring();
extern pardf pd_load();

static pardf load_def();          /* Forward */

/********************* Functions *****************************/
hash_table hashpintype(plis, whichcn)
pardf plis;
int whichcn;
{
hash_table res;
pardf p;
int i;

gmaketab(&res, memgp, TRUE);
    loop_over_list(p, plis)
        for (i = 0; i < p->cn[whichcn].count; ++i)
            defpin(p->name, p->cn[whichcn].names[i], i, res);
    return(res);
} static defpin(partname, pinname, pinno, tab)
string partname, pinname;
int pinno;
hash_table tab;
{
keyrec k;

k.partname = partname;
    k.pinname = pinname;
    if (! ghashinsert(pinno, tab, &k, sizeof(keyrec)))
        errexit("Part '%s' has been trashed", partname);
}
```

```
pardf findparts(partname)
string partname;
{
    libs = libsopen(phonyargs, "PDL", "r");
    if (libs == NULL) {
        printf("Cannot open library '%s'.\n", fopname(NULL));
        exit(1);
    }
    marktime("Opened libraries");
    to_upper(partname);
    partname = sstring(partname);
    initialize();
    top = load_def(partname);
    make_holder();
    marktime("Loaded");
    findhlevel(top);
    sortplist();
    inpintab = hashpintype(plist, CON_INP);
    outpintab = hashpintype(plist, CON_OUT);
    standardize();
    closelibs();
    return(plist);
} static errexit(s, p1, p2, p3)
string s, p1, p2, p3;
{
    printf("Findparts Error: ");
    printf(s, p1, p2, p3);
    printf("\n");
    exit(8);
} static assert(c)
boolean c;
{
    if (! c) {
        printf("Assertion failure\n");
        abort();
    }
} static initialize()
{
    memgp = gpalloc(1024);
    pmaketab(&typetab, memgp);
    plist = NULL;
} boolean plintless(a, b)
pardf a, b;
{
    return(a < b);
} static para make_para()
{
para res;

res = new(pararec);
    res->hlevel = -1;
    res->color = 0;
    res->nkept = 0;
    res->sigids = NULL;
    res->pinmap = NULL;
    return(res);
```

```
static pardf load_def(s)
string s;
{
pardf p;
subco m;
int i;

if (phashget(&p, typetab, s))
        return(p);
    p = NULL;
    for (i = 0; libs[i] != NULL; ++i) {
        p = pd_load(s, libs[i], memgp);
        if (p != NULL)
            break;
    }
    if (p == NULL) {
        printf("Cannot find '%s'.\n", s);
        exit(1);
    }
    phashinsert(p, typetab, s);
    p->next = plist;
    plist = p;
    p->aux = make_para();
    loop_over_list(m, p->mods)
        m->def = load_def(m->rname);
    return(p);
} static int findhlevel(p)
pardf p;
{
subco m;
int lev, max;

if (p->aux->hlevel >= 0)
        return(p->aux->hlevel);
    max = -1;
    loop_over_list(m, p->mods) {
        lev = findhlevel(m->def);
        if (lev > max)
            max = lev;
    }
    p->aux->hlevel = max + 1;
    return(p->aux->hlevel);
} boolean levelless(a, b)
pardf a, b;
{
    return(a->aux->hlevel < b->aux->hlevel);
} static sortplist()
{
    plist = (pardf) listsort(plist, &plist->next, NULL, levelless);
} static standardize()
{
subco m;

loop_over_list(curp, plist) {
        loop_over_list(m, curp->mods) {
            fixpins(m, TRUE);

if (pin == NULL || pin->num > i) {
                pin = new(copinrec);
```

```
                fixpins(m, FALSE);
        }
} static fixpins(mod, outpins)
subco mod;
boolean outpins;
{
pardf def;
copin *lis, pin, *pp;
int *acptr, actuals, formals, i;
string *fnames;
keyrec k;
hash_table tab;
boolean by_name, toofew;

def = mod->def;
    toofew = FALSE;
    if (outpins) {
        lis = &mod->opins;
        acptr = &mod->nout;
        actuals = *acptr;
        formals = def->p_nout;
        fnames = def->p_outnames;
        tab = outpintab;
    } else {
        lis = &mod->ipins;
        acptr = &mod->nin;
        actuals = *acptr;
        formals = def->p_nin;
        fnames = def->p_innames;
        tab = inpintab;
        if (actuals < formals)
            toofew = TRUE;
    }
    if (def->vari) {
        varipins(lis, mod, outpins);
        return;
    }
    k.partname = def->name;
    by_name = FALSE;
    loop_over_list(pin, *lis) {
        if (pin->name == NULL) {
            assert(pin->num >= 0);
            if (pin->num >= formals)
                errexit("%s/%s has too many %s pins", curp->name,
                        mod->iname, outpins ? "output" : "input");
            pin->name = fnames[pin->num];
        } else {
            by_name = TRUE;
            k.pinname = pin->name;
            if (! ghashget(&pin->num, tab, &k, sizeof(keyrec)))
                errexit("%s/%s has illegal pin %s", curp->name,
                        mod->iname, pin->name);
        }
    }
    if (by_name) {
        pin = *lis;
        *lis = (copin) listsort(pin, &pin->next, &pin->num, plintless);
    }
    for (i = 0, pp = lis; i < formals; ++i) {
        pin = *pp;
        if (pin == NULL || pin->num > i) {
            pin = new(copinrec);
            pin->next = *pp;
```

```
                *pp = pin;
                pin->link = NULL;
                pin->s = NULL;
                pin->m = mod;
                pin->num = i;
                pin->name = fnames[i];
                if (def->level != PRIM_LEV)
                    make_sig(pin, outpins);
            } else {
                assert(pin->num == i);
            }
            pp = &pin->next;
            while (*pp != NULL && (*pp)->num == pin->num) {
                sigmerge(pin, *pp);
                pin->next = (*pp)->next;
                pp = &pin->next;
                -- actuals;
            }
        }
        if (actuals > formals) {
            errexit("%s/%s has too many %s pins", curp->name,
                        mod->iname, outpins ? "output" : "input");
        }
        *acptr = formals;
        if (toofew)
            fillinbidis(mod);
} static make_sig(pin, isout)
copin pin;
boolean isout;
{
signa s;

if (! isout)
        printf("Warning: Unconnected input %s/%s(%s)\n",
                    curp->name, pin->m->iname, pin->name);
    s = new(signarec);
    pin->s = s;
    s->rpins = NULL;
    s->dpins = NULL;
    *(isout ? &s->dpins : &s->rpins) = pin;
    s->signames = NULL;
    s->outsiders = NULL;
    s->aux = 0;
    s->next = curp->sigs;
    curp->sigs = s;
} static sigmerge(p1, p2)
copin p1, p2;
{
signa s1, s2;
copin *p, q;
conec *pcn, cn;
stril *pstr;

printf("Warning: A pin was connected by name and by position.\n");
    s1 = p1->s;
    s2 = p2->s;
    assert(s1 != NULL && s2 != NULL);
    if (s1 == s2)
        return;

for (p = &s1->rpins; *p != NULL; p = &(*p)->link);
        s2->rpins
```

```
    for (q = *p; q != NULL; q = q->link)
        q->s = s1;
    s2->rpins = NULL;

for (p = &s1->dpins; *p != NULL; p = &(*p)->link);
    *p = s2->dpins;
    for (q = *p; q != NULL; q = q->link)
        q->s = s1;
    s2->dpins = NULL;

for (pcn = &s1->outsiders; *pcn != NULL; pcn = &(*pcn)->next);
    *pcn = s2->outsiders;
    for (cn = *pcn; cn != NULL; cn = cn->next)
        curp->cn[cn->whichcn].sigs[cn->index] = s1;
    s2->outsiders = NULL;

for (pstr = &s1->signames; *pstr != NULL; pstr = &(*pstr)->next);
    *pstr = s2->signames;
    s2->signames = NULL;
} static varipins(lis, mod, outpins)
copin *lis;
subco mod;
boolean outpins;
{
copin pin;
boolean by_name;
char text[10];
char *p, *q;

pin = *lis;
    by_name = pin != NULL && pin->name != NULL;
    if (by_name) {
        loop_over_list(pin, *lis) {
            q = pin->name;
            assert(q != NULL);
            p = q + strlen(q) - 1;
            if (*p < '0' || *p > '9')
                errexit("%s/%s has illegal pin %s", curp->name,
                                mod->iname, pin->name);
            for ( ; p >= q && *p >= '0' && *p <= '9'; --p);
            ++p;
            pin->num = atoi(p);
        }
        pin = *lis;
        *lis = (copin) listsort(pin, &pin->next, &pin->num, plintless);
    }
    p = outpins ? "O" : "I";
    loop_over_list(pin, *lis) {
        assert(pin->num >= 0);
        sprintf(text, "%s%d", p, pin->num);
        pin->name = sstring(text);
    }
} static fillinbidis(mod)
subco mod;
{
copin ipin, opin;

loop_over_list(ipin, mod->ipins) {
        if (ipin->s != NULL)
            continue;
        loop_over_list(opin, mod->opins)
            if (opin->name == ipin->name)
```

```
                    break;
        if (opin == NULL) {
            if (mod->def->level != PRIM_LEV) {
                errexit("%s/%s is missing input pin %s",
                            curp->name, mod->iname, ipin->name);
            }
            continue;
        }
        if (opin->s == NULL) {
            printf("Warning: Pin %s/%s(%s) is unconnected\n",
                        curp->name, mod->iname, ipin->name);
        } else {
            ipin->s = opin->s;
            ipin->link = opin->s->rpins;
            opin->s->rpins = ipin;
        }
    }
} static closelibs()
{
int i;

for (i = 0; libs[i] != NULL; ++i) {
        lclose(libs[i]);
        libs[i] = NULL;
    }
} static make_holder()
{
pardf h;
int i;

h = new(pardfrec);
    h->next = plist;
    plist = h;
    h->name = sstring("_HOLDER_");
    h->vari = FALSE;
    h->secured = FALSE;
    h->aux = make_para();
    h->simsub = NULL;
    h->truthtable = NULL;
    h->fdate = NULL;
    h->fname = NULL;
    h->ann = NULL;
    h->sigs = NULL;
    for (i = 0; i < 3; ++i) {
        h->cn[i].count = 0;
        h->cn[i].sigs = NULL;
        h->cn[i].names = NULL;
    }
    top_globals(h);
    top_mod(h);
} static signa top_sig(h)
pardf h;
{
signa s;

s = new(signarec);
    s->next = h->sigs;
    h->sigs = s;
    s->rpins = NULL;
```

```
    s->aux = 0;
    s->outsiders = NULL;
    s->signames = NULL;
    return(s);
} static top_mod(h)
pardf h;
{
int i, j;
subco m;
copin p, lis;

m = new(subcorec);
    h->mods = m;
    m->next = NULL;
    m->iname = sstring("MAIN");
    m->rname = top->name;
    m->def = top;
    m->nin = top->p_nin;
    m->nout = top->p_nout;
    for (i = 0; i < 2; ++i) {
        lis = NULL;
        for (j = top->cn[i].count; --j >= 0; ) {
            p = new(copinrec);
            p->next = lis;
            lis = p;
            p->name = NULL;
            p->num = j;
            p->m = m;
            p->s = top_sig(h);
            *(i == 0 ? &p->s->rpins : &p->s->dpins) = p;
            p->link = NULL;
        }
        *(i == 0 ? &m->ipins : &m->opins) = lis;
    }
    top = h;
} static top_globals(h)
pardf h;
{
int i;
signa s;

h->p_ndef = 4;
    h->p_defnames = new_array(4, string);
    h->p_defs = new_array(4, signa);
    h->p_defnames[0] = sstring("LOGIC_0");
    h->p_defnames[1] = sstring("LOGIC_1");
    h->p_defnames[2] = sstring("LOGIC_X");
    h->p_defnames[3] = sstring("LOGIC_Z");
    for (i = 0; i < 4; ++i) {
        s = top_sig(h);
        h->p_defs[i] = s;
        s->signames = new(strilrec);
        s->signames->next = NULL;
        s->signames->name = h->p_defnames[i];
        s->outsiders = new(conecrec);
        s->outsiders->next = NULL;
        s->outsiders->whichcn = CON_DEF;
        s->outsiders->index = i;
```

```c
/*
        plink.c

Part Defininition Linker

*/ include <stdio.h>
include "lsigpal.h"
#include "libdef.h"
#include "lsinhsh.h"
#include "pfind.h"

#define loop_over_list(p, lis) for (p = lis; p != NULL; p = p->next)
#define new(ty) (ty *) qalloc(sizeof(ty), memgp)
#define new_array(n, ty) (ty *) qalloc((n) * sizeof(ty), memgp)

define OUTSIDE 1000000000 define UNTOUCHED -2
define MISMATCH  -1 typedef int *intptr;

/******************** Variables ****************************/ extern memory_group memgp;

static pardf top, plist, oldtop, oldplist;
static hash_table usepintab, defpintab;
static pardf curp;
static int color;
static char do_flatten;
static int *ios, *indices, *pins;
static string newnet;

extern string filename;
extern char pd_xcode[];
extern string sstring();

static string *postab[] = { &filename, NULL };
extern pardf pd_read();
extern FILE *fopread();

extern char stats;

/******************** Functions ****************************/ main(argc, argv)
int argc;
string argv[];
{
    if (argc < 2) {
        printf("Usage: plink <modname> [-f] <libname> ...\n");
        exit(1);
    }
    defoption(0, "-F", &do_flatten, 1);
    defoption(1, "-I", (char *) &newnet, 0);
    defoption(0, "STATS", &stats, 1);
    read_optables(NULL, NULL, postab);
    lsioption(argc, argv);
    inittime();
    fopstate();
    prelink();
    if (newnet != NULL)
```

```
        do_inc();
    do_link();
    marktime("Flattened");
    if (do_flatten)
        writendl();
    tottime("Total");
} static prelink()
{
    plist = findparts(filename);
    printf("Loaded\n");
    loop_over_list(top, plist)
        if (top->next == NULL)
            break;
    color = 1;
    usepintab = hashpintype(plist, CON_USE);
    defpintab = hashpintype(plist, CON_DEF);
    resolveglobals();
    pinaliases();
    measure();
    marktime("Analyzed");
} static do_inc()
{
pardf p;
FILE *fp;
LIBRARY *lp;

oldtop = top;
    oldplist = plist;
    fp = fopread(newnet, "NET");
    if (fp == NULL)
        errexit("Cannot open '%s'.", fopname(NULL));
    p = pd_read(fp, memgp);
    if (pd_rcode[0] == '9')
        exit(8);
    lp = lopen("PDL", "wf");
    if (lp == NULL)
        errexit("Cannot open '%s'.", fopname(NULL));
    loop_over_list(p, p)
        pd_save(p, lp);
    lclose(lp);
    marktime("Compiled");
    prelink();
    correspondences();
    marktime("Matched");
} static errexit(s, p1, p2, p3)
string s, p1, p2, p3;
{
    printf("PLINK Error: ");
    printf(s, p1, p2, p3);
    printf("\n");
    exit(8);
} static assert(c)
boolean c;
{
    if (! c) {
        printf("Assertion failure\n");
        abort();
```

```
} static resolveglobals()
{
subco m;
pardf def;
para daux;
string *newusenames, *ptr;
signa *newuses, sig;
keyrec k;
int pinno, i, usecount;
stril str, slis, *slistail;
conec con;

loop_over_list(curp, plist) {
        k.partname = curp->name;
        usecount = curp->p_nuse;
        ++ color;
        slis = NULL;
        slistail = &slis;
        loop_over_list(m, curp->mods) {
            def = m->def;
            daux = def->aux;
            if (daux->color == color)
                continue;
            daux->color = color;
            for (i = def->p_nuse, ptr = def->p_usenames; --i >= 0; ++ptr) {
                k.pinname = *ptr;
                if (ghashget(&pinno, defpintab, &k, sizeof(keyrec)))
                    continue;
                if (ghashget(&pinno, usepintab, &k, sizeof(keyrec)))
                    continue;
                ghashinsert(usecount++, usepintab, &k, sizeof(keyrec));
                str = new(strilrec);
                *slistail = str;
                slistail = &str->next;
                *slistail = NULL;
                str->name = *ptr;
            }
        }
        if (slis != NULL) {
            newusenames = new_array(usecount, string);
            newuses = new_array(usecount, signa);
            for (pinno = 0; pinno < curp->p_nuse; ++pinno) {
                newusenames[pinno] = curp->p_usenames[pinno];
                newuses[pinno] = curp->p_uses[pinno];
            }
            loop_over_list(str, slis) {
                newusenames[pinno] = str->name;
                sig = new(signarec);
                newuses[pinno] = sig;
                sig->next = curp->sigs;
                curp->sigs = sig;
                sig->signames = NULL;
                sig->rpins = NULL;
                sig->dpins = NULL;
                con = new(conecrec);
                con->next = NULL;
                con->whichcn = CON_USE;
                con->index = pinno;
                sig->outsiders = con;
                ++ pinno;
            }
            curp->p_nuse = usecount;
            curp->p_usenames = newusenames;
```

```
            }
        }
        if (top->p_nuse != 0) {
            printf("The following global names are not defined:\n");
            for (i = 0; i < top->p_nuse; ++i)
                printf("    %s\n", top->p_usenames[i]);
            exit(1);
        }
    }
} pinaliases()
{
signa sig;
subco mod;
copin pin;
int i, j, k, pinno, sigcount, iocount, base, rsigcount, modcount;
para caux;
keyrec ky;
suba maux;

loop_over_list(curp, plist) {
        caux = curp->aux;

sigcount = 0;
        loop_over_list(sig, curp->sigs)
            sig->aux = sigcount++;
        indices = new_array(sigcount, int);
        for (i = 0; i < sigcount; ++i)
            indices[i] = i;

loop_over_list(mod, curp->mods) {
            maux = new(subarec);
            mod->aux = maux;
            maux->mod = mod;
            maux->idnum = MISMATCH;
            maux->map = MISMATCH;
            if (mod->def->vari) {
                assert(mod->def->p_uses == 0);
                assert(mod->def->level == PRIM_LEV);
                maux->nio = mod->nin + mod->nout;
            } else {
                maux->nio = mod->def->aux->nio;
            }
        } iocount = 0;
        loop_over_list(mod, curp->mods)
            iocount += mod->aux->nio;
        pins = new_array(iocount, int);
        for (i = 0; i < iocount; ++i)
            pins[i] = -1;

i = 0;
        base = 0;
        modcount = 0;
        ky.partname = curp->name;
        loop_over_list(mod, curp->mods) {
            assert(i == base);
            ++ modcount;
            loop_over_list(pin, mod->ipins) {
                if (pins[i]!= NULL)
```

```
            pin[i] = pin->s->aux;
        ++i;
    }
    for (j = 0; j < mod->def->p_nuse; ++j) {
        ky.pinname = mod->def->p_usenames[j];
        if (ghashget(&pinno, usepintab, &ky, sizeof(keyrec))) {
            pins[i++] = curp->p_uses[pinno]->aux;
        } else {
            assert(ghashget(&pinno, defpintab, &ky, sizeof(keyrec)));
            pins[i++] = curp->p_defs[pinno]->aux;
        }
    }
    if (! mod->def->vari) {
        for (j = 0; j < mod->aux->nio; ++j) {
            k = mod->def->aux->ios[j];
            if (j != k)
                equate(base + j, base + k);
        }
    }
    base += mod->aux->nio;
}
assert(i == base);
assert(i == iocount);
caux->nsubmod = modcount;
rsigcount = 0;
for (i = 0; i < sigcount; ++i) {
    for (j = i; j != indices[j]; j = indices[j]);
    if (j != i)
        indices[i] = j;
}
for (i = 0; i < iocount; ++i)
    if (pins[i] != -1)
        pins[i] = indices[pins[i]];
loop_over_list(sig, curp->sigs)
    sig->aux = indices[sig->aux];
rsigcount = 0;
for (i = 0; i < sigcount; ++i)
    indices[i] = indices[i] == i ? rsigcount++ : -1;
caux->nsigs = rsigcount;
for (i = 0; i < iocount; ++i)
    if (pins[i] != -1)
        pins[i] = indices[pins[i]];
loop_over_list(sig, curp->sigs)
    sig->aux = indices[sig->aux];
caux->nsubio = iocount;
caux->subios = pins;

caux->nio = curp->p_nin + curp->p_nout + curp->p_nuse;
ios = new_array(caux->nio, int);
caux->ios = ios;
for (i = caux->nio; --i >= 0; ios[i] = -1);
for (i = rsigcount; --i >= 0; indices[i] = -1);
j = 0;
for (i = 0; i < curp->p_nin; ++i, ++j)
    insert(j, curp->p_ins[i]->aux);
for (i = 0; i < curp->p_nout; ++i, ++j)
    insert(j, curp->p_outs[i]->aux);
for (i = 0; i < curp->p_nuse; ++i, ++j)
    insert(j, curp->p_uses[i]->aux);
j = 0;
for (i = 0; i < rsigcount; ++i)
    indices[i] = indices[i] == -1 ? j++ : OUTSIDE + indices[i];
caux->nintsig = j;
for (i = 0; i < iocount; ++i)
    if (pins[i] != -1)
        pins[i] = indices [pins[i]]
```

```
            loop_over_list( 'g, curp->sigs)
                sig->aux =  .dices[sig->aux];
    }
} static insert(ionum, whichsig)
int whichsig, ionum;
{
int prev;

prev = indices[whichsig];
    if (prev == -1) {
        indices[whichsig] = ionum;
        ios[ionum] = ionum;
    } else {
        ios[ionum] = ios[prev];
        ios[prev] = ionum;
    }
} static equate(p1, p2)
int p1, p2;
{
int s1, s2;

s1 = pins[p1];
    s2 = pins[p2];
    while (indices[s1] != s1)
        s1 = indices[s1];
    while (indices[s2] != s2)
        s2 = indices[s2];
    indices[s2] = s1;
} static measure()
{
subco m;
int pincount, sigcount, modcount, pos;
para daux, caux;
suba maux;

loop_over_list(curp, plist) {
        caux = curp->aux;
        pincount = caux->nio;
        sigcount = caux->nintsig;
        modcount = caux->nsubmod;
        pos = 0;
        loop_over_list(m, curp->mods) {
            maux = m->aux;
            daux = m->def->aux;
            maux->pos = pos;
            maux->pinoff = pincount;
            maux->sigoff = sigcount;
            maux->modoff = modcount - pos;
            if (m->def->vari)
                pincount += maux->nio;
            else
                pincount += daux->totpins;
            sigcount += daux->totsigs;
            modcount += daux->totmods;
            ++ pos;
        }
        caux->totpins = pincount;
        caux->totsigs = sigcount;
        caux->totmods = modcount;
```

}

```
typedef struct simpinREC {
    struct simoccREC *block;
    struct simpinREC *fanout;
} simpinrec, *simpin;

typedef struct simoccREC {
    pardf ref;
    struct simoccREC *kids, *prefix;
    struct simpinREC *pins;
    int nin, nout;
} simoccrec, *simocc;

simocc occarr;
simpin pinarr, sigarr;

int modcount, sigcount, pincount;

static do_link()
{
para taux;

taux = top->aux;
    assert(taux->nio == 0);
    assert(top->p_nin == 0 && top->p_nout == 0);

modcount = taux->totmods;
    pincount = taux->totpins;
    sigcount = taux->totsigs;

occarr = new_array(modcount, simoccrec);
    pinarr = new_array(pincount, simpinrec);
    sigarr = new_array(sigcount, simpinrec);

flat_top();

printf("%d %d %d\n", modcount, sigcount, pincount);
} static flat_top()
{
subco m;
suba maux;
int i, sigl;

m = top->mods;
    maux = m->aux;
    for (i = 0; i < maux->nio; ++i) {
        sigl = top->aux->subios[i];
        pinarr[i].fanout = sigarr + sigl;
        pinarr[i].block = occarr;
    }
    occarr->prefix = NULL;
    flatten(m, occarr, pinarr, sigarr + maux->sigoff);
} static flatten(presub, occbase, parentpins, locsigs)
subco presub;
simocc occbase;
simpin parentpins, locsigs;
{
pardf p;
simpin pinbase;
subco m;
```

```
    suba maux;
    int i, j, sigl;

p = presub->def;
        kid = occbase + presub->aux->modoff;
        occbase->nin = presub->nin;
        occbase->nout = presub->nout;
        occbase->ref = p;
        occbase->kids = kid;
        occbase->pins = parentpins;
        j = 0;
        loop_over_list(m, p->mods) {
            maux = m->aux;
            pinbase = parentpins + maux->pinoff;
            for (i = 0; i < maux->nio; ++i) {
                sigl = p->aux->subios[j++];
                if (sigl >= OUTSIDE) {
                    pinbase->fanout = (parentpins + (sigl - OUTSIDE))->fanout;
                } else if (sigl == -1) {
                    pinbase->fanout = NULL;
                } else {
                    pinbase->fanout = locsigs + sigl;
                }
                pinbase->block = kid;
                ++ pinbase;
            }
            kid->prefix = occbase;
            flatten(m, kid, parentpins + maux->pinoff, locsigs + maux->sigoff);
            ++ kid;
        }
    } static writedl()
{
int i, j;
pardf p;

p = top->mods->def;
    printf("MODULE %s;\n", p->name);
    write_io("INPUTS", 0, p);
    write_io("OUTPUTS", 1, p);
    write_io("USE_GLOBALS", 2, p);
    printf("DEFINE\n");
    j = 0;
    for (i = 0; i < p->p_nin; ++i, ++j)
        printf("    W%d = (%s);\n", pinarr[j].fanout - sigarr, p->p_innames[i]);
    for (i = 0; i < p->p_nout; ++i, ++j)
        printf("    W%d = (%s);\n", pinarr[j].fanout - sigarr, p->p_outnames[i]);
    for (i = 0; i < p->p_nuse; ++i, ++j)
        printf("    W%d = (%s);\n", pinarr[j].fanout - sigarr, p->p_usenames[i]);
    for (i = 0; i < modcount; ++i)
        writeprim(occarr + i);
    printf("END MODULE;\n");
} static write_io(s, whichcn, p)
string s;
int whichcn;
pardf p;
{
int i;

printf("%s", s);
    for (i = 0; i < p->cn[whichcn].count; ++i) {
        if (i != 0)
            printf(",");
```

```
        printf(" %s", r->cn[whichcn].names[i]);
    }
    printf(";\n");
} static writeprim(occ)
simocc occ;
{
int pos;
pardf def, parent;
simocc pre;
subco m;

def = occ->ref;
    if (def->level != PRIM_LEV)
        return;
    pre = occ->prefix;
    parent = pre->ref;
    pos = occ - pre->kids;
    loop_over_list(m, parent->mods)
        if (--pos < 0)
            break;
    printf("    %s", m->iname);
    write_pins(occ->pins + occ->nin, occ->nout, m->opins);
    printf("\n    = %s", def->name);
    write_pins(occ->pins, occ->nin, m->ipins);
    printf(";\n");
} static write_pins(pin, count, mpin)
simpin pin;
int count;
copin mpin;
{
int i;

printf(" (");
    i = 0;
    while (--count >= 0) {
        if (pin->fanout != NULL) {
            if (i != 0) {
                printf(", ");
                if (i % 4 == 0)
                    printf("\n            ");
            }
            printf("W%d=%s", pin->fanout == NULL ? -1 : pin->fanout - sigarr, mpin
            ++ i;
        }
        ++ pin;
        mpin = mpin->next;
    }
    printf(")");
}

/************** Functions for Incremental Change Extraction **********/
/* Deleted in this copy */
```

Undefin. Subroutines

A number of subroutines used in the sample implementation of Fastlink
are not defined in the sample code. How these routines are implemented
is not relevant to the operation of Fastlink. To fully explain their
operation would require the source code for a substantial fraction of
the LSI Logic CAD system. Simpler versions could be substituted without harm.

```
defoption      - This helps initialize the command argument parser
fopname        - This looks up the name of a file
fopread        - This opens a designated file
fopstate       - This initializes the file opening package
ghashget       - This does a hash-table lookup with a variable-size key
ghashinsert    - This does a hash-table insert with a variable-size key
gmaketab       - This creates a variable-size-key hash-table
gpalloc        - This initializes the memory allocator
inittime       - This initializes the run-time statistics package
lclose         - This closes a part-definition library
libsopen       - This opens a set of part-definition libraries
listsort       - This sorts a linked list using Merge-Sort
lopen          - This opens a part-definition library
lsioption      - This parses command line arguments
marktime       - This prints run-time statistics
pd_load        - This reads a compiled part-definition
pd_read        - This reads part-definitions from a netlist
pd_save        - This writes a part-definition into a library
phashget       - This does a hash-table lookup with an integer key
phashinsert    - This does a hash-table insert with an integer key
pmaketab       - This creates an integer-key hash-table
qalloc         - This allocates a chunk of memory
read_optables  - This helps initialize the command argument parser
sstring        - This maintains a hash-table of character strings
to_upper       - This converts a character string to capital letters
tottime        - This prints a summary of run-time statistics
```

Missing Include Files

The C code includes the files lsigpal.h, libdef.h, and lsinhsh.h. These
files contain definitions for the memory allocator, the part-definition
library package, and the hash-table package, respectively. How these
packages are implemented is not critical to the success of Fast-Link.
The C code also includes the files pfind.h and pardef.h. These files
define the data-structures used to represent part-definitions in the
Fast-Link algorithm. A wide variety of other data-structures could be
used instead. These files follow:

```
/*
      pfind.h

Definitions for findparts().

*/ define pardf_x struct paraREC *
define subco_x struct subaREC * include "pardef.h"

typedef char *string;

typedef struct paraREC {
    pardf type;
    int hlevel, color, nio, nsigs, nintsig, nsubio, nsubmod;
    int nkept;
```

```
        int *ios;
        int *subios;
        int *sigids;
        int *pinmap;
        int totsigs, totpins, totmods;
} pararec, *para;

typedef struct subaREC {
        subco mod;
        int pos, nio, idnum;
        int map;
        int pinoff, sigoff, modoff;
} subarec, *suba;

typedef struct {
        string partname, pinname;
} keyrec;

/****************** External Declarations *****************/ extern pardf findparts();
extern hash_table hashpintype();

/*
        pardef.h

Data Structure for Representing Part Definitions

*/ ifndef pardefH
define pardefH ifndef lsigpalH
include "lsigpal.h"
#endif

/****************** Data Types for AUX Fields *************/ ifndef signa_x
define signa_x int
endif ifndef subco_x
define subco_x int
endif ifndef pardf_x
define pardf_x int
#endif

/****************** Struct Definitions ********************/ typedef char *chstring;

typedef struct strilREC *stril;
typedef struct conecREC *conec;
typedef struct delvaREC *delva;
typedef struct copinREC *copin;
typedef struct signaREC *signa;
typedef struct subcoREC *subco;
typedef struct pardfREC *pardf;

typedef struct strilREC {            /* String List */
```

```c
    stril next;
    chstring name;
} strilrec;

typedef struct conecREC {          /* Outside connections */
    conec next;
    int index;
    int whichcn;
} conecrec;

typedef struct delvaREC {          /* Delay Values */
    delva next;
    chstring name;
    int count;
    unsigned short val[6];
} delvarec;

typedef struct copinREC {          /* Subcomponent Pin */
    copin next, link;
    signa s;
    subco m;
    int num;
    chstring name;
    delva delay;
    char inv;
    char pad1, pad2, pad3;
} copinrec;

typedef struct signaREC {          /* Signal */
    struct signaREC *next;
    stril signames;
    copin dpins, rpins;
    conec outsiders;
    signa_x aux;
} signarec;

typedef struct subcoREC {          /* Subcomponent */
    struct subcoREC *next;
    chstring iname, rname;
    pardf def;
    int nin, nout;
    copin ipins, opins;
    delva delay;
    subco_x aux;
} subcorec;

typedef struct foreignREC {        /* Outside world connection */
    int count;                     /* Array size */
    signa *sigs;                   /* Array of signals */
    chstring *names;               /* Array of names */
} foreignrec, *foreign;

typedef struct pardfREC {          /* Part Definition */
    struct pardfREC *next;
    chstring name;
    foreignrec cn[4];
    subco mods;
    signa sigs;
    chstring simsub, truthtable, fdate, fname;
    int ann;
    int level;
    delva delays;
    char vari, secured, pindels;
    char pad1;
    pardf_x aux;
} pardfrec;
```

```c
/****************** Fake Field Names **********************/ define p_nin cn[0].count
define p_ins cn[0].sigs
define p_innames cn[0].names define p_nout cn[1].count
define p_outs cn[1].sigs
define p_outnames cn[1].names define p_nuse cn[2].count
define p_uses cn[2].sigs
define p_usenames cn[2].names define p_ndef cn[3].count
define p_defs cn[3].sigs
define p_defnames cn[3].names /********************** Flags *****************************/ define CON_INP  0      /* Outside Connection Flags */
define CON_OUT  1
#define CON_USE  2
define CON_DEF  3 define UNKN_LEV 0.     /* Level Flags */
define FUNC_LEV 1
#define PRIM_LEV 2
#define CELL_LEV 3
#define MULT_LEV 4
#define HARD_LEV 5
define SYST_LEV 6 endif
```

What is claimed is:

1. A method of flattening a hierarchical design description, comprising:

providing a hierarchical design description including feed-through information;

prior to flattening, propagating the feed-through information up through the design hierarchy by combining nets at higher levels of design hierarchy which are joined by feed-throughs in a submodule; and after combining the nets at the higher levels, flattening the hierarchical design description.

2. A method of flattening a hierarchical design description, comprising:

providing a hierarchical design description including information about implicit connections made via a common signal name or global signal connection;

prior to flattening, propagating the implicit information up through the design hierarchy by combining nets which are joined by a common signal name, or global signal connection; and after combining the nets, flattening the hierarchical design description.

3. A method of flattening a hierarchical design description, comprising:

prior to flattening, performing the steps of:

providing a hierarchical design description including instances of submodules, nets and pins;

propagating cumulative totals of numbers of instances of submodules, nets and pins up through the hierarchy;

computing partial sums of these totals for each submodule; and pre-allocating memory for storing a flattened representation of the hierarchical description, based on the cumulative totals; and after performing the steps recited hereinabove, applying a flattening algorithm recursively to the hierarchical design description, which algorithm takes advantage of the attribute totals and partial sums to simplify the computations that must be performed at each instance in the flattened design.

4. A method of flattening a hierarchical design, comprising:

defining a plurality of modules, submodules and primitives, each having attributes;

hierarchically arranging the modules, submodules and primitives;

creating a top-level module;

re-ordering the attributes in a consistent manner;

propagating certain of the attributes up to the top-level module;

counting the attributes at each level;

pre-calculating a cumulative total of attributes, from the bottom of the hierarchy to the top of the hierarchy, and recording partial sums;

pre-allocating memory for storing a flattened representation of the hierarchical description, based on the pre-calculated cumulative totals; and after pre-calculating the cumulative total of attributes and after pre-allocating memory, applying a flattening algorithm recursively to the design, which algorithm takes advantage of the attribute totals and partial sums to simplify the computations that must be performed at each instance in the flattened design.

5. A method for flattening a hierarchical description of an electronic circuit into a flat description thereof, comprising:

providing a hierarchical design data structure including at least one module type description, at least one module instance description, connectivity information, and I/O pin descriptions;

wherein:

each module type description includes an I/O pin list, an internal connection list, a list of submodules, and a list of global signals used;

each module instance description includes a reference to a module type description, an instance name and an I/O pin connection list;

said connectivity information includes lists of all nets (wires) and connections thereto; and each such I/O pin connection includes an attribute indicating the module to which it is attached, and an attribute indicating the net to which it is attached; and further comprising:

(a) creating a top-level module containing the entire hierarchical design data structure into which all external connections are subsumed, wherein the top-level module has no inputs or outputs, and adding the top-level module to the existing hierarchical design data structure at the highest hierarchical level;

(b) determining the hierarchical level of each module type in the hierarchical design data structure and associating the level with each module type description;

(c) placing the hierarchical module type descriptions in a list sorted in order of increasing hierarchical level.

(d) re-arranging, as required, the order of I/O pin connections associated with each module instance so that the list of I/O pin connections to each module instance of the same type is in the same order by pin function;

(e) propagating all references to global variables in submodules up the hierarchy by working from the bottom level of the hierarchical design to the top and adding all global signal references used by a submodule to the list of global signals used by its parent module type if they are not already listed by the parent module type;

(f) analyzing each module type for submodules contained in the module type which have multiple I/O pins connected to the same wire at a lower level in the hierarchy, and eliminating any such multiple I/O pin connections by deleting the nets connected to all but one I/O pin of the submodule, and moving all other I/O pin and signal connections of the deleted nets to the one retained net;

(g) totalizing the number of internal wires, submodules, and submodule I/O pins directly or indirectly contained in each module type, and attaching partial sums found while computing these totals to the submodules of each module type;

(h) allocating memory storage space for an output data structure comprising a module instance array, a wire instance array, and an I/O pin instance array by multiplying the known allocation sizes of module instances, pin instances, and wire instances, by the numbers of submodules, submodule I/O pins, and internal wires, respectively, and performing the actual storage space allocation; and (i) recursively flattening the hierarchical design into an output data structure, and storing the output data structure in the allocated storage space.

6. Method according to claim 5, wherein:

the flattening process includes a call to a recursive flattening routine which takes four inputs;

the four inputs comprising:

a module instance description to be flattened, and pointers into each of three instance arrays allocated in the output data structure;

the top level call to said flattening routine operates on the top-level module instance description and pointers to the beginnings of the storage allocated for each of the three as-yet unloaded instance arrays;

wherein:

all I/O pin descriptions for the module instance being processed have been placed prior to each recursive call to the flattening routine into the output data structure's I/O pin instance array in the order that they occur in the module's I/O pin description list, starting at the location in the I/O pin instance array to which the I/O pin instance array pointer passed to the flattening routine points and proceeding onward;

the submodule instance description for the module being processed is placed into the output data structure's submodule instance array at the location in the submodule instance array to which the submodule instance array pointer passed to the flattening routine points;

all internal wire instances of the module being processed are placed into the output data structure's wire instance array in the order that they occur in the module's type description, starting at the location in the wire instance array to which the wire instance pointer passed to the flattening routine points and proceeding onward;

further comprising:

adding the offset to the pointer in the instance array to get the pointer to the instance's submodules;

storing the pointer into the pin array in the instance record;

filling in the records for the pins of the module instance's submodules;

adding an offset to the pin array argument to find their locations;

assigning each pin record a pointer to the record for the submodule it belongs to;

assigning each pin that is connected to an internal wire of the module a pointer to that wire by adding the wire number to the pointer in the wire array;

assigning each pin that is connected to an external wire a pointer to that wire by copying the pointer to that wire stored in the record for the appropriate I/O pin of that module;

wherein:

each submodule instance placed in the output array is given a pointer to the module instance being processed (its parent module); and a recursive call is made to the flattening routine for each submodule of the module being processed, after all of the previous steps have been accomplished and passing the flattening routine the submodule instance description, and adjusted pointers into the three instance arrays accounting for instances already added to the arrays, the pointer adjustments being the partial sums;

upon completion of the flattening routine, the previously allocated output data structure contains the completely flattened hierarchical design data structure.

* * * * *